(12) United States Patent
Verma et al.

(10) Patent No.: US 12,346,645 B2
(45) Date of Patent: Jul. 1, 2025

(54) SEMICONDUCTOR DEVICE AND METHOD AND SYSTEM OF ARRANGING PATTERNS OF THE SAME

(71) Applicant: TAIWAN SEMICONDUCTOR MANUFACTURING COMPANY LTD., Hsinchu (TW)

(72) Inventors: Anurag Verma, Hsinchu (TW); Meng-Kai Hsu, Hsinchu County (TW); Johnny Chiahao Li, Hsinchu (TW); Sheng-Hsiung Chen, Hsinchu County (TW); Cheng-Yu Lin, Hsinchu County (TW); Hui-Zhong Zhuang, Kaohsiung (TW); Jerry Chang Jui Kao, Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 807 days.

(21) Appl. No.: 17/674,585

(22) Filed: Feb. 17, 2022

(65) Prior Publication Data
US 2023/0259686 A1 Aug. 17, 2023

(51) Int. Cl.
*G06F 30/392* (2020.01)
*H10D 89/10* (2025.01)

(52) U.S. Cl.
CPC .......... *G06F 30/392* (2020.01); *H10D 89/10* (2025.01)

(58) Field of Classification Search
CPC ...... G06F 30/39; G06F 30/392; G06F 30/394; G06F 30/398; H10D 89/10; H10D 89/60; H10D 84/975
USPC .......................................................... 716/133
See application file for complete search history.

(56) References Cited

U.S. PATENT DOCUMENTS

| | | | |
|---|---|---|---|
| 2006/0265684 A1* | 11/2006 | Buehler | G06F 30/394 716/112 |
| 2007/0033562 A1* | 2/2007 | Correale | G06F 30/39 716/133 |

* cited by examiner

*Primary Examiner* — Paul Dinh
(74) *Attorney, Agent, or Firm* — WPAT LAW; Anthony King

(57) ABSTRACT

A semiconductor device, method, and system of arranging patterns of the same are provided. The method includes generating a plurality of gate patterns and conductive patterns, wherein each of the plurality of gate patterns and conductive patterns is located at a first horizontal level and extends along a first direction. The method also includes selecting one of the gate patterns as an input pin or one of the conductive patterns as an output pin. The method further includes generating, based on a selected gate pattern or a selected conductive pattern, a plurality of metallization patterns. Each of the plurality of metallization patterns is located at a second horizontal level overlying the first horizontal level and extends along a second direction substantially perpendicular to the first direction.

20 Claims, 22 Drawing Sheets

SEMICONDUCTOR DEVICE AND METHOD AND SYSTEM OF ARRANGING PATTERNS OF THE SAME

BACKGROUND

Industry requirements for decreased size in integrated circuits (ICs) have resulted in smaller devices which consume less power yet provide more functionality at higher speeds. The miniaturization process has also resulted in stricter design and manufacturing specifications as well as reliability challenges. Various electronic design automation (EDA) tools generate, optimize, and verify standard cell layout designs for integrated circuits while ensuring that the standard cell layout design and manufacturing specifications are met.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
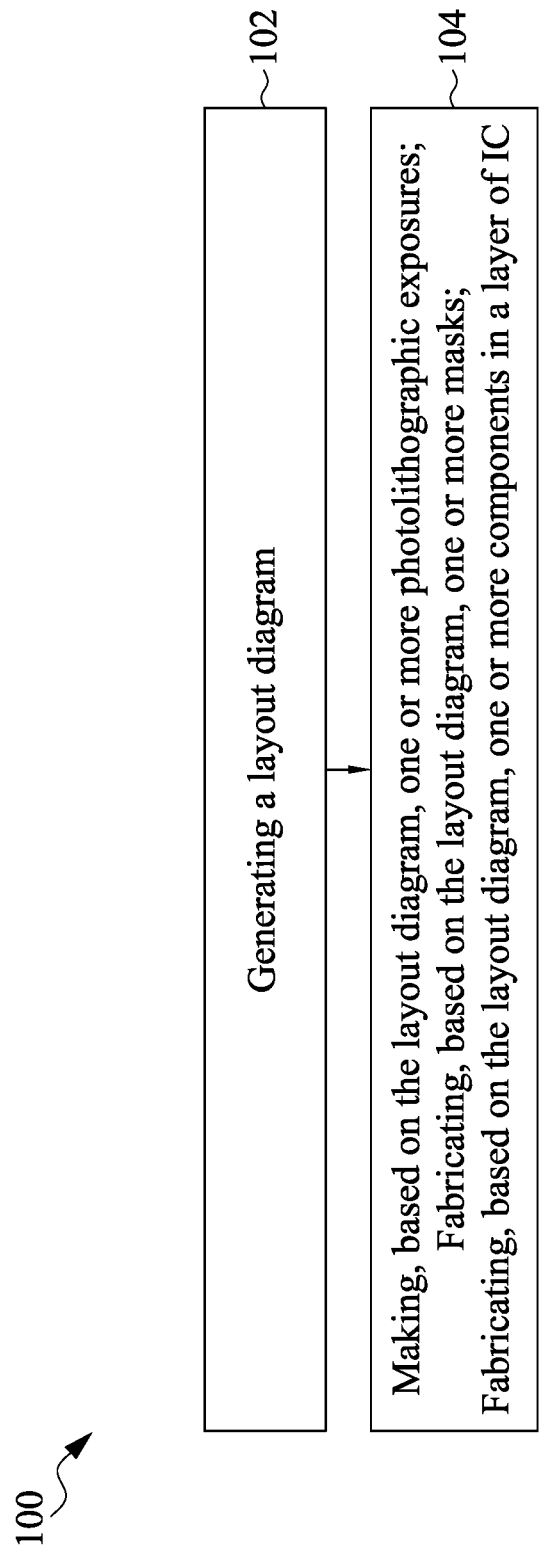
FIG. 1 is a flowchart of a method for manufacturing a semiconductor device according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 illustrates a method 100 of manufacturing a semiconductor device, in accordance with some embodiments. FIGS. 2, 3, 4, and 5 illustrate methods of manufacturing a layout of a semiconductor device, in accordance with some embodiments.

In some embodiments, method 100 includes operations 102 and 104. The method begins with operation 102 in which a layout diagram is generated. The layout diagram is discussed in more detail as follows with respect to FIGS. 2-5.

The method 100 continues with operation 104: based on the layout diagram, in which at least one of (A) one or more photolithographic exposures are made or (B) one or more semiconductor masks are fabricated or (C) one or more components in a layer of a semiconductor device are fabricated.

Figure 2:
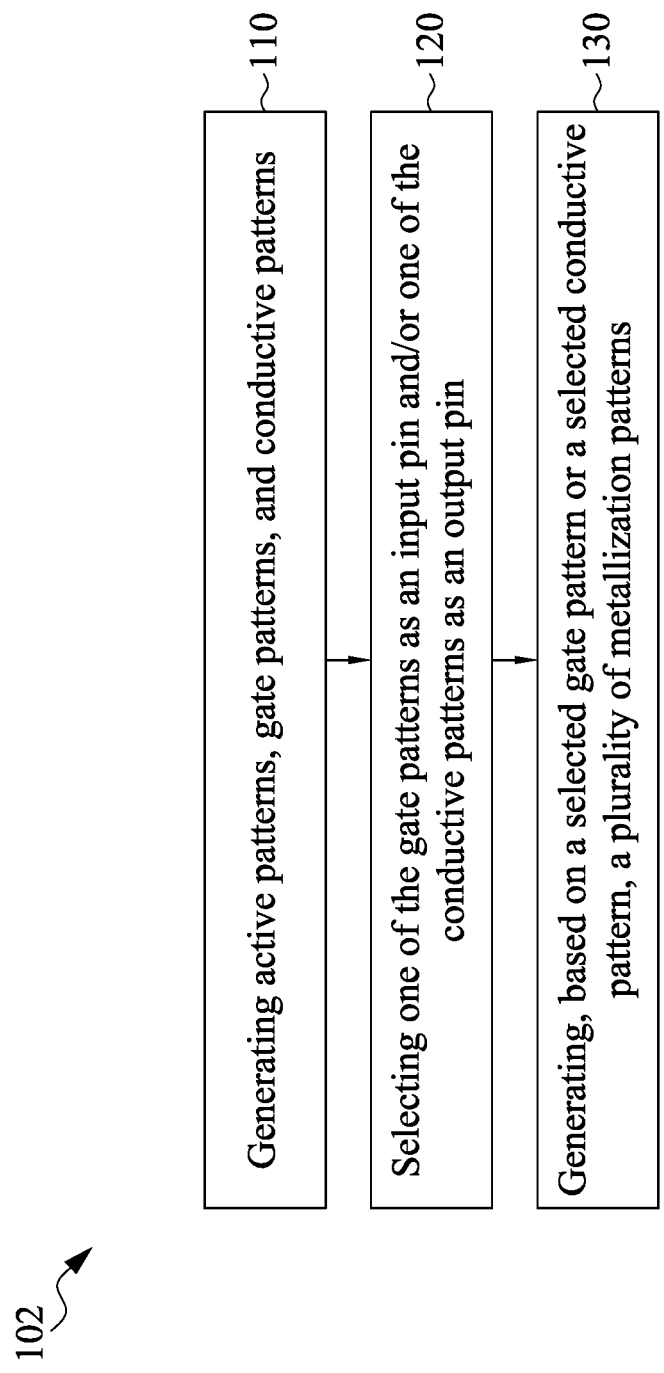
FIG. 2 is a flowchart of a method for manufacturing a layout of a semiconductor device according to various aspects of the present disclosure.

As shown in FIG. 2, the operation 102 can include operations 110, 120, and 130. In some embodiments, operation 110 can include generating active patterns, gate patterns, and conductive patterns. In some embodiments, the active patterns can correspond to active regions of a semiconductor device. In some embodiments, the gate patterns can correspond to gate structures of a semiconductor device. In some embodiments, the conductive pattern can correspond to metal diffusion (MD) conductive features of a semiconductor device.

In some embodiments, the active region can include one or more fin structures for forming, for example, Fin Field-Effect Transistor (FinFET). In other embodiments, the active region can include one or more nanosheet structures. In some embodiments, the term "active region" discussed in the present disclosure may be also referred to as "OD" (oxide diffusion area).

In some embodiments, the gate structure can include a gate dielectric layer and a gate electrode layer. The gate dielectric layer may be a single layer or multiple layers. The gate dielectric layer may include silicon oxide ($SiO_x$), silicon nitride ($Si_xN_y$), silicon oxynitride (SION), or a combination thereof. The gate electrode layer can be disposed on the gate dielectric layer. The gate electrode layer can be made of conductive material, such as polysilicon, aluminum (Al), copper (Cu), tungsten (W), titanium (Ti), tantalum (Ta), or other applicable materials. In some embodiments, the gate electrode layer includes a work function layer. The work function layer is made of metal material, and the metal material may include N-work-function metal or P-work-function metal.

In some embodiments, the patterns of the MD conductive features are arranged as source/drain (S/D) contacts that are electrically connected to source regions and/or drain regions of a semiconductor device. The MD conductive feature can include a barrier layer and a conductive layer on the barrier layer. The barrier layer may include titanium, tantalum, titanium nitride, tantalum nitride, manganese nitride or a combination thereof. The conductive layer may include metal, such as tungsten (W), copper (Cu), Ru, Ir, Ni, Os, Rh, Al, Mo, Co, alloys thereof, or combinations thereof.

The operation 120 can include selecting at least one of the gate patterns as an input pin and/or at least one of the conductive patterns as an output pin. In some embodiments, the gate structure can be utilized to serve as a gate of a transistor, a gate of a memory, or a dummy gate. In some embodiments, the gate of a transistor (or a gate of a memory) can be imposed on a supply voltage, and electrically connected to a power source through conductive vias and metallization layers (e.g., M0, M1 . . . , etc). The gate pattern, corresponding to the aforesaid gate, can be referred to as an input pin. Similarly, the conductive pattern, corresponding to the MD conductive feature serving as, for example, a drain of a transistor or a drain of a memory, can be referred to as an output pin.

The operation 130 can include generating, based on a selected gate pattern or a selected conductive pattern, metallization patterns. The metallization patterns can correspond to metallization layers of a semiconductor device, such as the zero metal layer (M0). The M0 of the metallization layers can be electrically connected to the gate structure or MD conductive feature through a conductive via. In this disclosure, the term "M0" or "M0 of the metallization layers" can refer to the lowest metallization layer of a semiconductor device configured to electrically connect the gate structure (or MD conductive feature) to upper metallization layers, such as M1, M2, and so on.

Figure 2A:
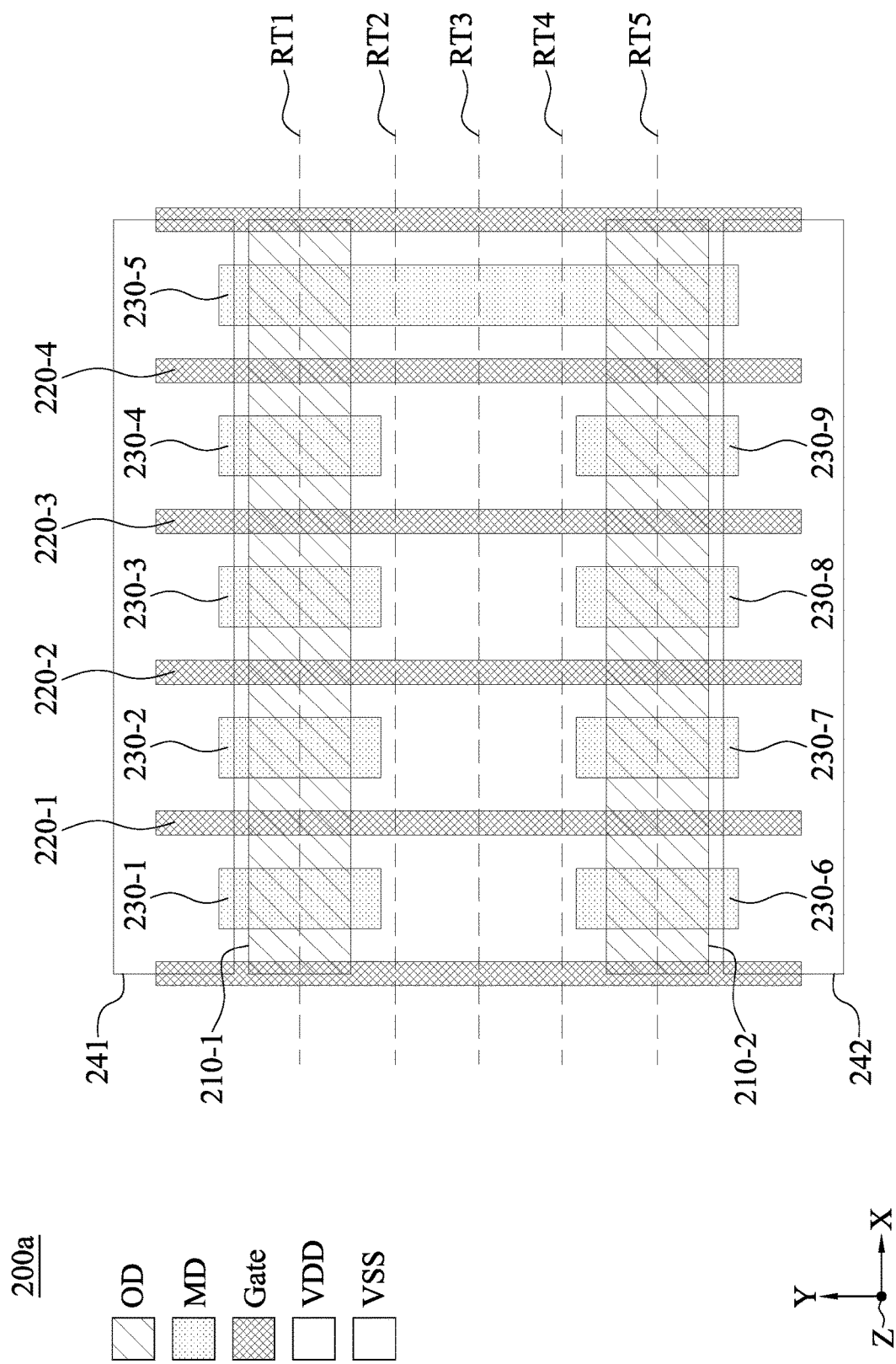
FIG. 2A, FIG. 2B, and FIG. 2C illustrate various stages in the manufacture of a layout for a semiconductor device, in accordance with some embodiments of the present disclosure.
Figure 2B:
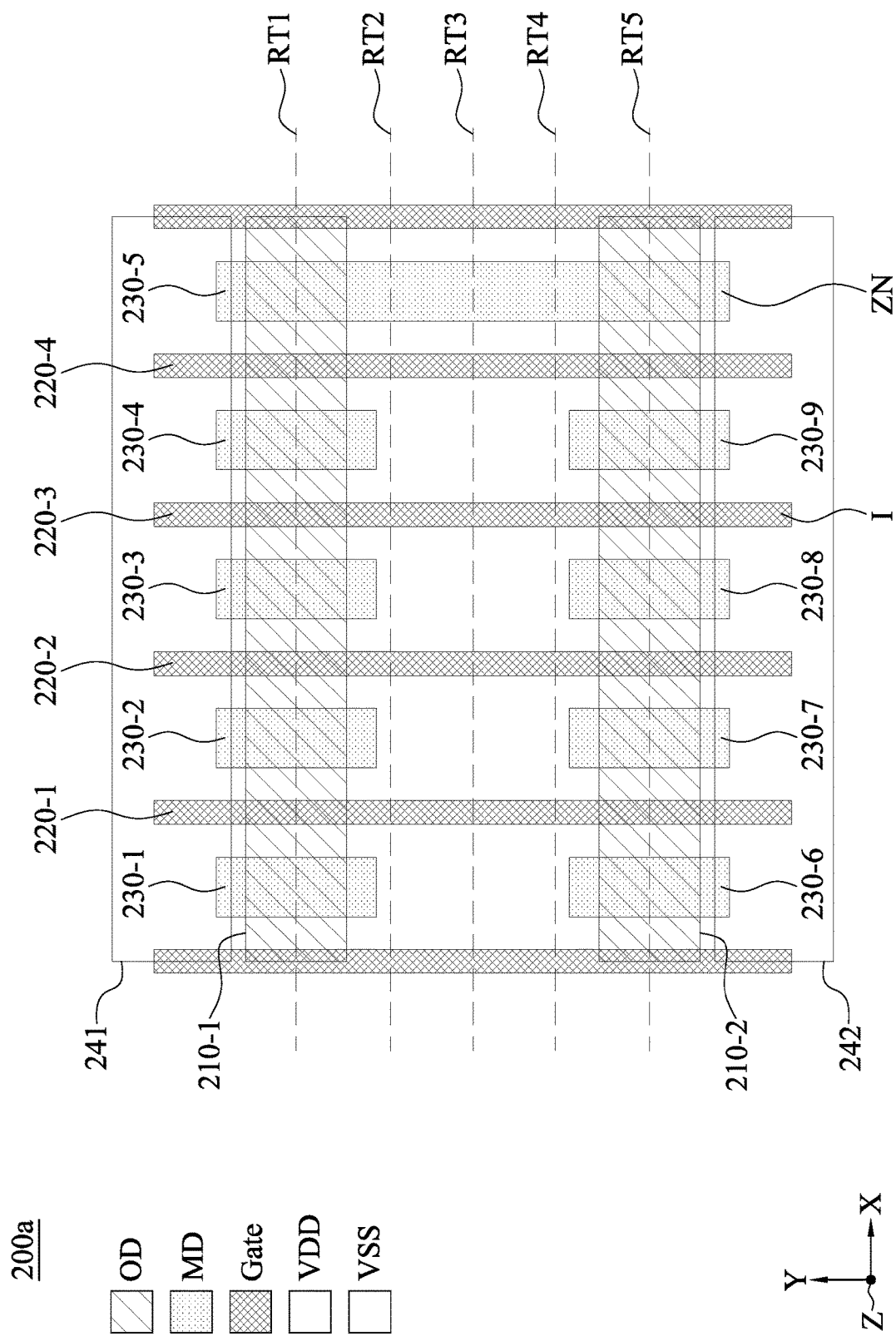
Figure 2C:
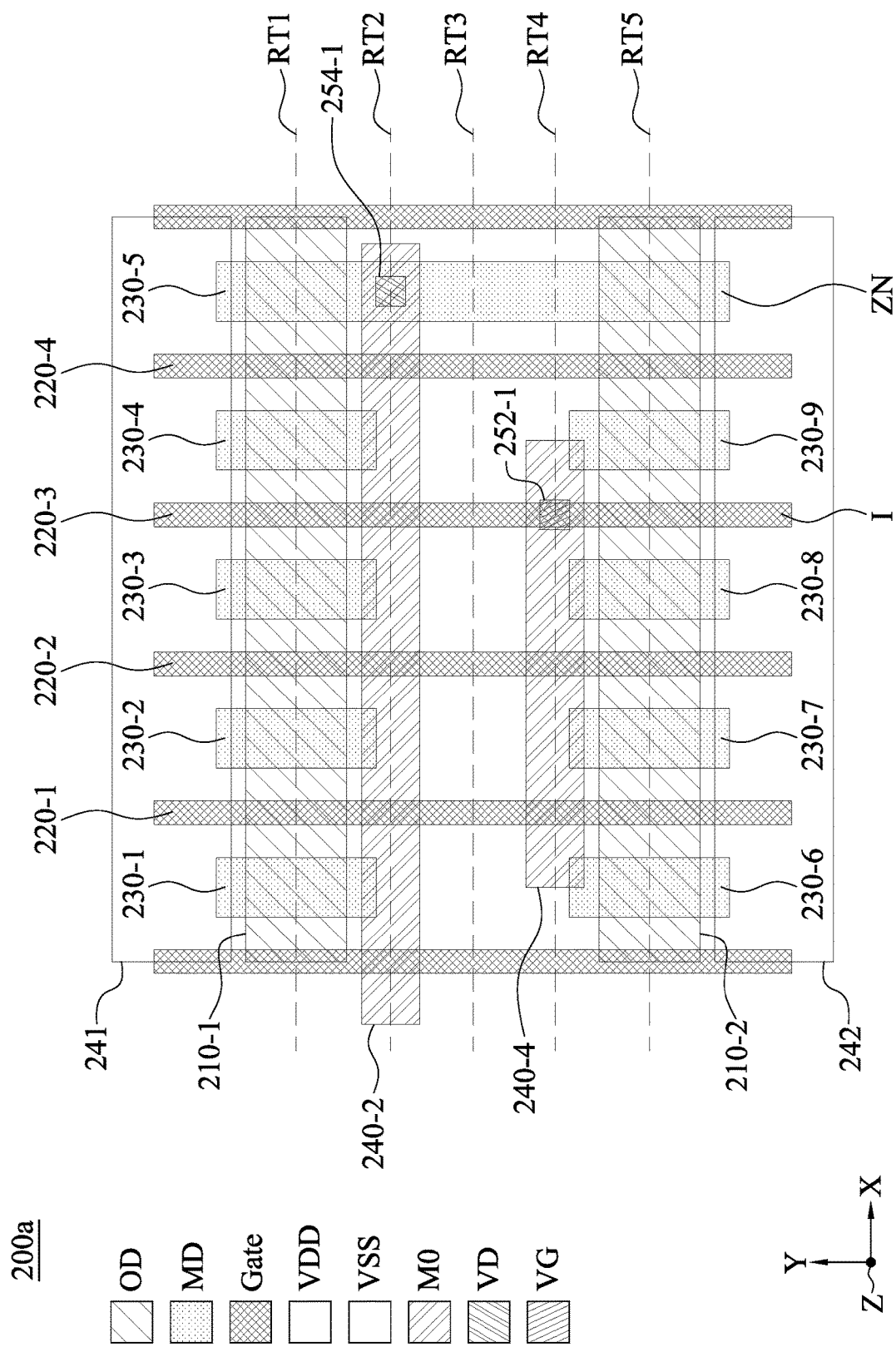

FIG. 2A, FIG. 2B, and FIG. 2C illustrate various stages of manufacturing a layout 200a of a semiconductor device corresponding to operation 102 of FIG. 2, in accordance with some embodiments of the present disclosure.

Referring to FIG. 2A, operation 102 can begin with forming active patterns 210-1, and 210-2, gate patterns 220-1, 220-2, 220-3, and 220-4, conductive patterns 230-1, 230-2, 230-3, 230-4, 230-5, 230-6, 230-7, 230-8, and 230-9 as well as wiring patterns 241 and 242. Each of the active patterns 210-1 and 210-2 can extend along an X-axis and be arranged along a Y-axis. Each of the gate patterns 220-1 to 220-4 can extend along the Y-axis and be arranged along the X-axis. Each of the conductive patterns 230-1 to 230-9 can extend along the Y-axis and at least partially be arranged along the X-axis. Each of the wiring patterns 241 and 242 can extend along the X-axis and be arranged along the Y-axis. The wiring patterns 241 and 242 can be power grid (PG) patterns which represent portions of longer corresponding power grid lines of a semiconductor device which has been fabricated based on layout 200a. In some embodiments, the wiring pattern 241 is designated for a first reference voltage and the wiring pattern 242 is designated for a second reference voltage. In some embodiments, the first reference voltage is VDD and the second reference voltage is VSS.

In a top-down sequence, the active patterns can be located at a first horizontal level. The gate patterns 220-1 to 220-4 as well as conductive patterns 230-1 to 230-9 can be located at a second horizontal level overlying the first horizontal level. The wiring patterns 241 and 242 can be located at a third horizontal level overlying the second horizontal level. It should be noted that the layout of the active patterns 210-1, 210-2, gate patterns 220-1 to 220-4 and conductive patterns 230-1 to 230-9 are merely an example, and can be modified based on requirements for fabricating a semiconductor device. As used herein, the term "first horizontal level," "second horizontal level," and "third horizontal level" refer to vertical positional relations of the patterns of the layout 200a. Although in this disclosure, the gate patterns 220-1 to 220-4 and the conductive patterns 230-1 to 230-9 are located at the second horizontal level, the gate structure and the MD conductive feature may be located at different horizontal levels or at least partially at the same horizontal level in an actual semiconductor device.

Further, the layout 200a can include routing tracks RT1, RT2, RT3, RT4, and RT5. Each of the routing tracks RT1 to RT5 can extend along the X-axis. The routing tracks RT1 to RT5 can be configured to define the location of the metallization patterns of M0, M1, M2, and so on.

It should be noted that FIG. 2A only illustrates a portion of a layout of a semiconductor device, or a portion of a layout within a cell. The layout 200a can further include other active patterns, gate patterns, conductive patterns, or other patterns.

Referring to FIG. 2B, at least one gate pattern can be selected as an input pin, and/or at least one conductive pattern can be selected as an output pin. In this embodiment, one gate and one conductive pattern are selected as input and output pins, respectively. The denotation "I" shown in FIG. 2B can refer to an input pin. The denotation "ZN" shown in FIG. 2B can refer to an output pin. In this embodiment, the gate pattern 220-3 is selected as an input pin, and the conductive pattern 230-5 is selected as an output pin as shown in FIG. 2B. In other embodiments, two or more gate patterns 220-1 to 220-4 can be selected as input pins. In other embodiments, two or more conductive patterns 230-1 to 230-9 can be selected as output pins. The number of the input and/or output pins is not intended to be limiting.

Referring to FIG. 2C, based on the selected gate pattern and/or the selected conductive pattern, metallization patterns of M0 can be generated accordingly. As described, the M0 of the metallization layer can be the lowest metallization layer to electrically connect the gate structure (or MD conductive feature) to upper metallization layers, such as M1, M2, and so on. The metallization patterns of M0 can extend along the X-axis. The metallization patterns of M0 can be located at the third horizontal level overlying the second horizontal level.

In some embodiments, when input and/or output pins of a semiconductor device are selected, metallization patterns of M0 can be generated to connect aforesaid input and/or output pins. As shown in FIG. 2C, the routing track RT2 can be selected, thereby forming a metallization pattern 240-2 extending along the routing track RT2. The metallization pattern 240-2 can serve as an output pin electrically connected to the selected conductive pattern 230-5. Further, the routing track RT4 can be selected, thereby forming a metallization pattern 240-4 along the routing track RT4. The metallization pattern 240-4 can serve as an input pin electrically connected to the selected gate pattern 220-3. In this embodiments, routing tracks RT1-RT5 can be selected based on the selected gate patterns and/or conductive patterns of a semiconductor device. For example, the routing track RT2 is selected to form the metallization pattern 240-2, thereby connecting the conductive pattern 230-5 and a selected gate pattern in another cell (not shown). In other embodiments, other routing tracks, such as RT1 and RT3, can be selected to serve as input and output pins electrically connected to the selected gate pattern 220-3 and conductive pattern 230-5, respectively. In some embodiments, the metallization patterns 240-2 and 240-4 can have different lengths along the X-axis.

In some embodiments, after the metallization patterns 240-2 and 240-4 are formed, interconnection patterns 254-1 and 252-1 can be generated accordingly, thereby connecting the metallization pattern 240-2 and conductive pattern 230-5 as well as the metallization pattern 240-4 and gate pattern 220-3, respectively. The interconnection pattern can correspond to a conductive via, and be located at a horizontal level between those of the gate pattern 220-1 to 220-5 and the metallization pattern of M0 (e.g., 240-2). As shown in FIG. 2C, the gate pattern 220-3, interconnection pattern 252-1, and metallization pattern 240-4 overlap along the Z direction. The conductive pattern 230-5, interconnection pattern 254-1, and metallization pattern 240-2 overlap along a Z-axis. In some embodiments, the interconnection pattern (e.g., 252-1), connecting the gate pattern and metallization pattern of M0, can be referred to as "VG." In some embodiments, the interconnection pattern (e.g., 254-1), connecting the conductive pattern and metallization pattern of M0, can be referred to as "VD."

In a comparative method of generating a layout of a semiconductor device, the metallization patterns of M0 are predetermined, and have fixed shapes. For example, all of the metallization patterns of M0 along the routing tracks RT1 to RT5 have the same lengths. In a comparative method, the metallization patterns of M0 are the lowest patterns to be selected as input and output pins. Thus, in order to connect the selected input and output pins of the metallization patterns of M0, the layout of the upper metallization patterns, such as M1, are designed to connect input and output pins. In the comparative example, only the layouts of the metallization patterns of M1 and/or higher metallization patterns (e.g., M2) are flexible to design a routing path to electrically connect different components. Further, in the comparative example, the layout of the metallization patterns of M0 is predetermined or fixed, and cannot be allowed to cross from one cell to another cell in order to meet design rules of the process technology. In this embodiment, the gate pattern and/or the conductive pattern can be the lowest pattern to be defined as the input and/or output pin. Thus, the layout of the metallization patterns of M0 is not predetermined in comparison with the comparative examples, contributing to freedom in the layout of the metallization patterns of M0.

Figure 3:
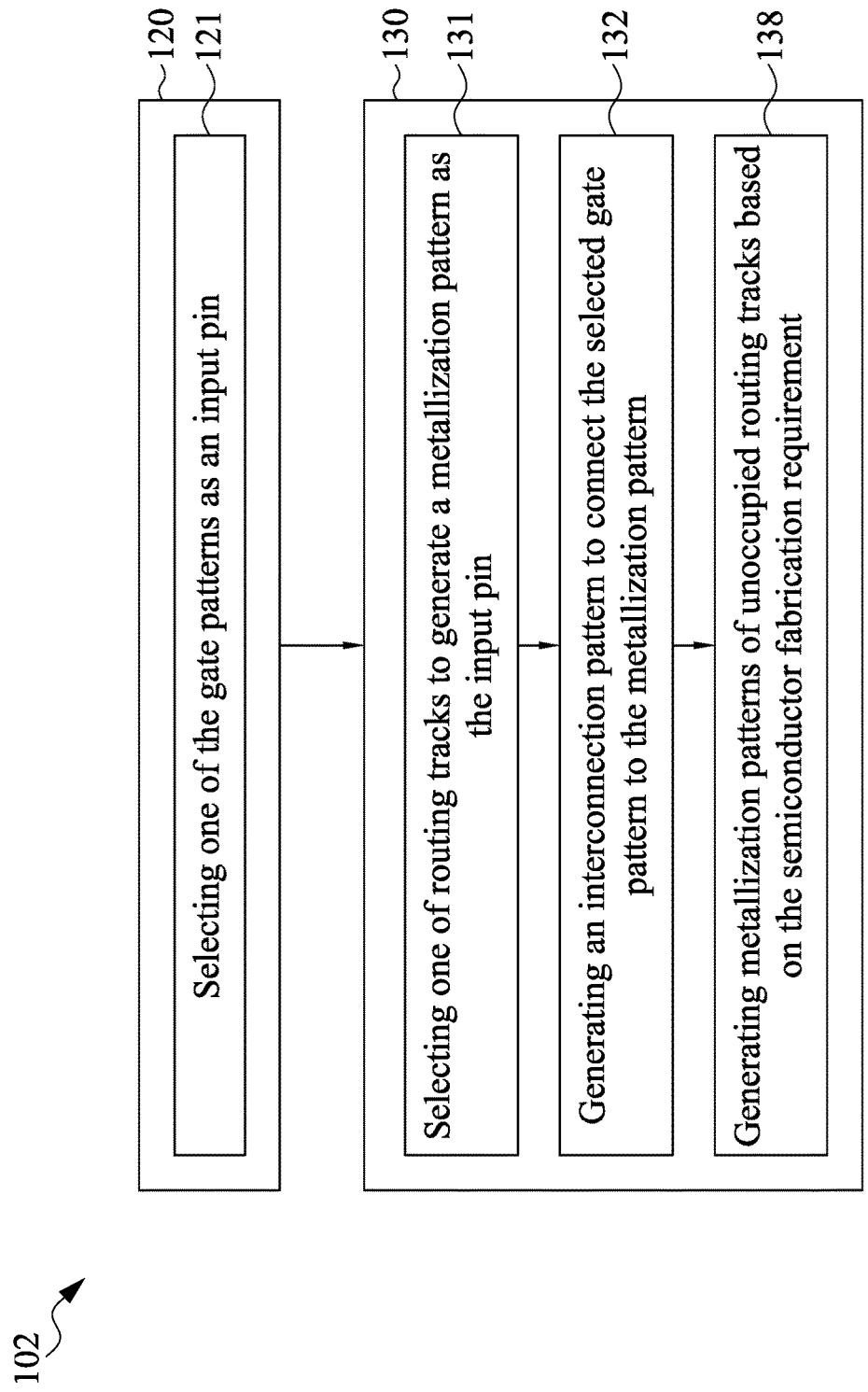
FIG. 3 is a flowchart of a method for manufacturing a layout of a semiconductor device according to various aspects of the present disclosure.

FIG. 3 is a flowchart of a method for manufacturing a layout of a semiconductor device according to various aspects of the present disclosure. More particularly, the method of FIG. 3 shows operations 120 and 130 of FIG. 2 in more detail, in accordance with one or more embodiments.

In some embodiments, operation 120 can include operation 121, and operation 130 can include operations 131, 132, and 138. In some embodiments, the operation 121 can include selecting at least one of the gate patterns as an input pin. From operation 121, the flow proceeds to operation 131. In some embodiments, operation 131 can include selecting at least one routing track to generate a metallization pattern of M0 as the input pin. In some embodiments, operation 132 can include generating an interconnection pattern to connect the selected gate pattern and the metallization pattern of M0. In some embodiments, operation 138 can include generating metallization patterns of M0 of unoccupied routing tracks based on the semiconductor fabrication requirement.

Figure 3A:
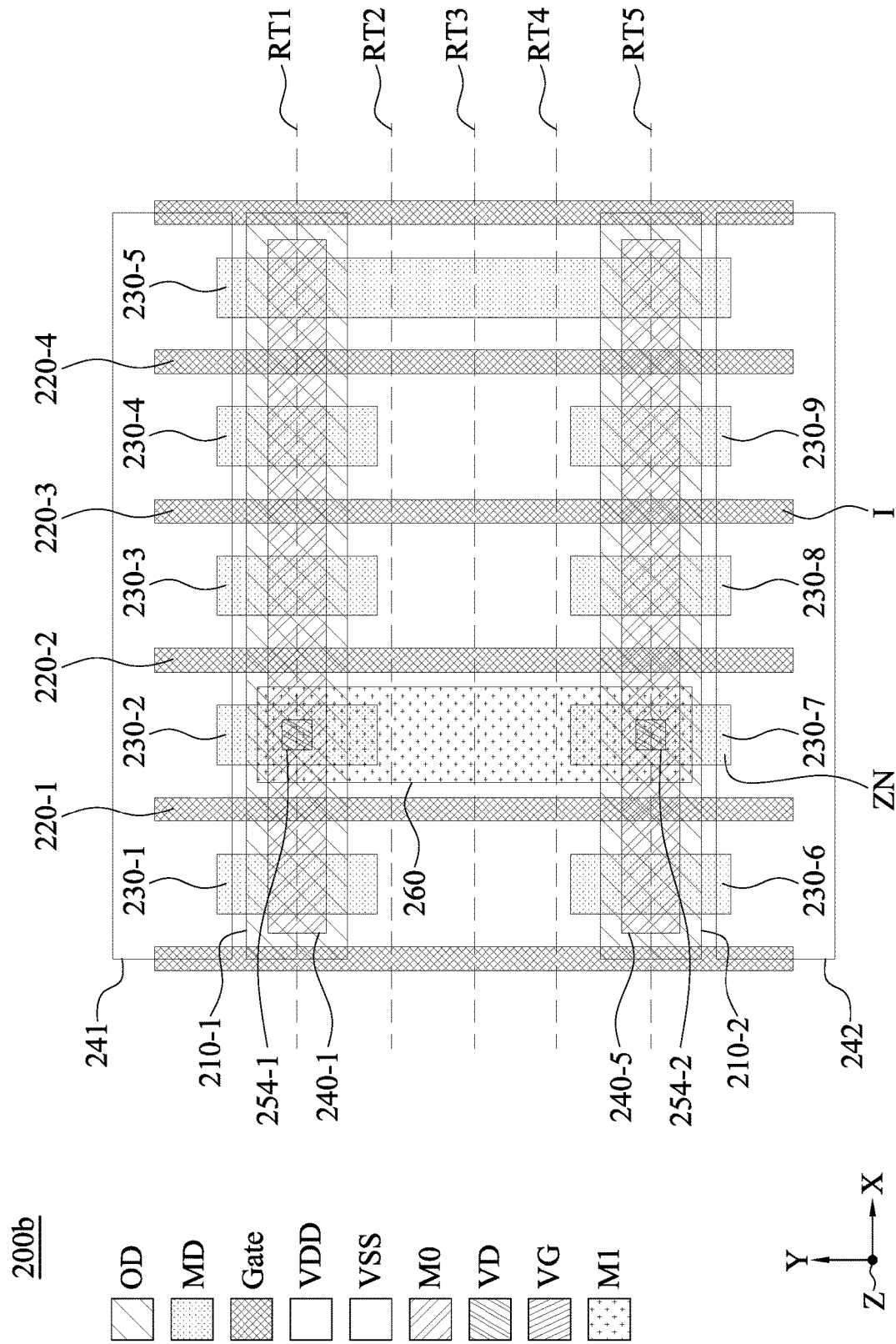
FIG. 3A, FIG. 3B, and FIG. 3C illustrate various stages in the manufacture of a layout for a semiconductor device, in accordance with some embodiments of the present disclosure.
Figure 3B:
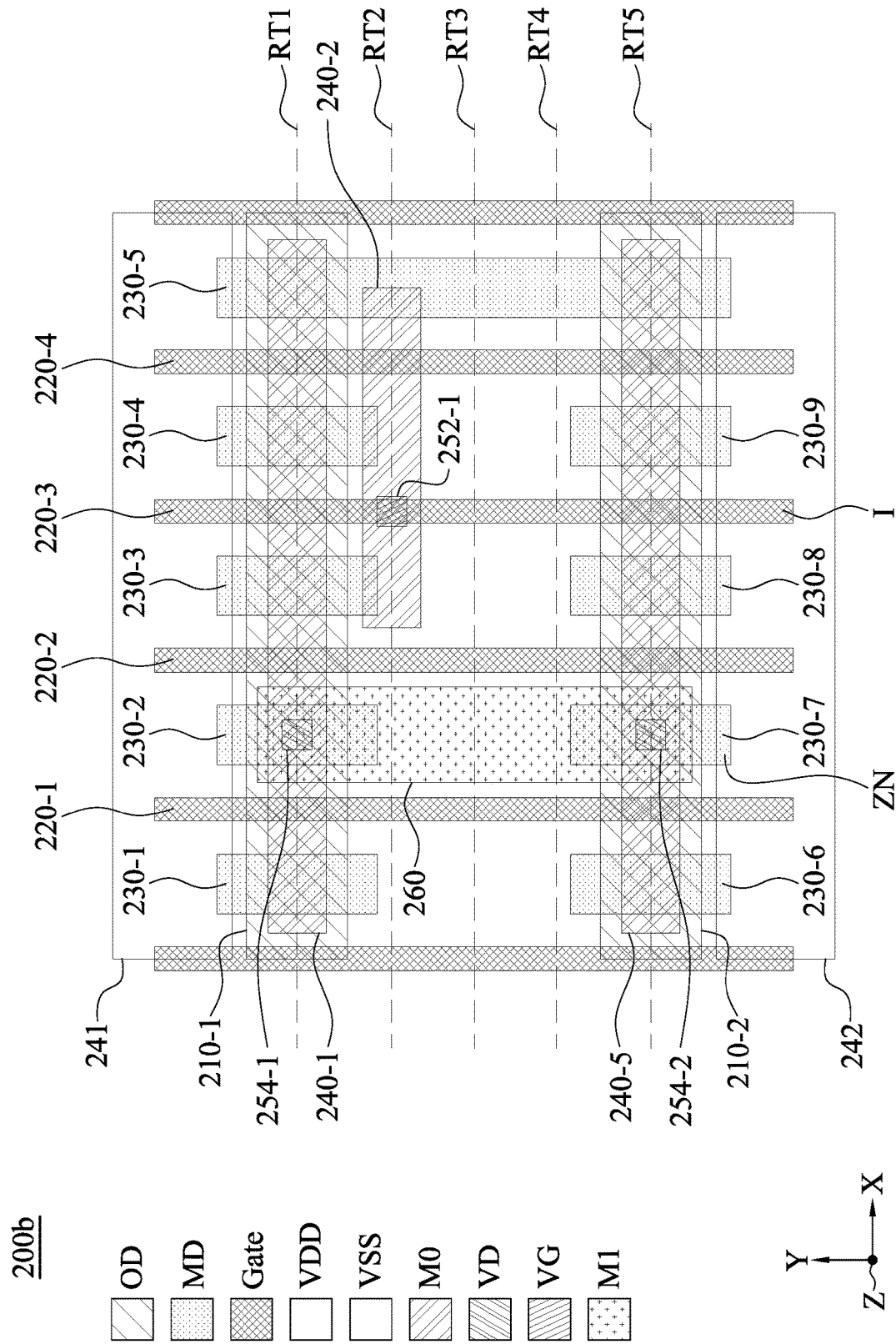
Figure 3C:
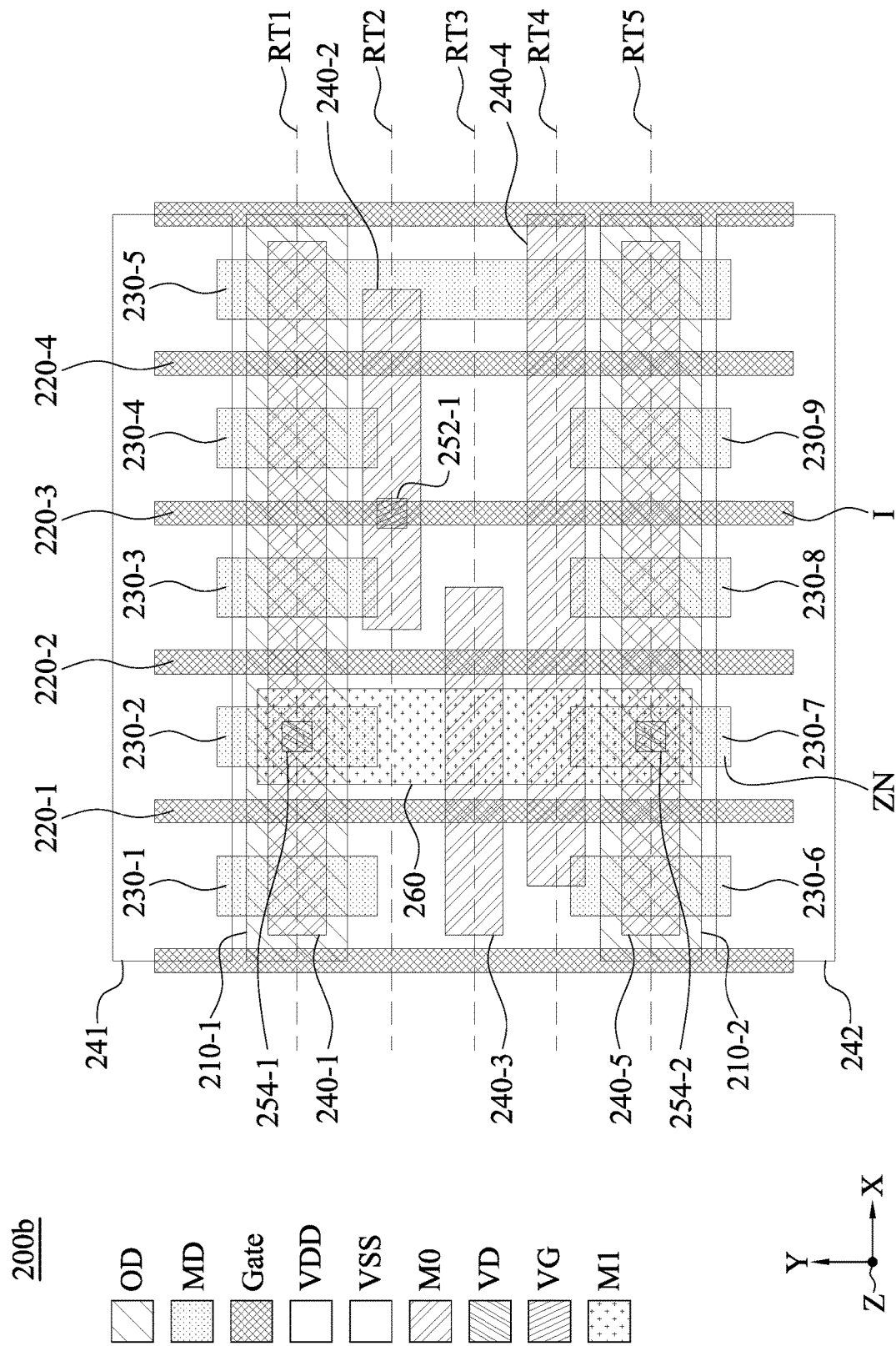

FIG. 3A, FIG. 3B, and FIG. 3C illustrate various stages of manufacturing a layout 200b of a semiconductor device corresponding to the method of FIG. 3, in accordance with some embodiments of the present disclosure.

Referring to FIG. 3A, in some embodiments, the output pins of conductive patterns and some of the metallization patterns of M0 can be predetermined, resulting in input pin(s) of the gate patterns and some of the metallization patterns of M0 to be unrestricted. For example, the conductive patterns 230-2 and 230-7 may be selected as output pins. The routing tracks RT1 and RT5 are selected to form metallization patterns 240-1 and 240-5 as output pins. The interconnection patterns 254-1 and 254-2 are generated to connect the selected metallization patterns of M0 and conductive patterns. Further, an upper metallization pattern 260 is generated to connect the conductive patterns 230-2 and 230-7. The metallization pattern 260 can correspond to the first metal layer (M1) of a semiconductor device, and located at a fourth horizontal level overlying the third horizontal level. In this embodiment, the input pin of the gate pattern is not predetermined. In this embodiment, at least one of the gate patterns 220-1 to 220-4 can be selected as an input pin. For example, the gate pattern 220-3 can be selected as an input pin.

Referring to FIG. 3B, one of routing tracks RT1 to RT5 can be selected to generate a metallization pattern as the input pin in accordance with some embodiments. As shown in FIG. 3B, since all of the space of routing tracks RT1 and RT5 is utilized to form the metallization patterns 240-1 and 240-5, one of the routing tracks RT2, RT3, and RT4 can be selected as the input pin. For example, the routing track RT2 can be selected to form the metallization pattern 240-2. Further, the interconnection pattern 252-1 can be generated accordingly to connect the selected gate pattern 220-3 and metallization pattern 240-2.

Referring to FIG. 3C, metallization patterns of remaining unoccupied routing tracks can be generated based on semiconductor fabrication requirements in accordance with some embodiments. After the formation of input and output pins of the metallization patterns of M0, the remaining space of the routing tracks RT1 to RT5, which is not occupied by the input and output pins of the metallization patterns, can be utilized to form metallization patterns of M0. These metallization patterns of M0 can correspond to dummy metallization layers or intra-cell wiring patterns, which can be an intra-cell conductor in a corresponding cell region in a semiconductor device having been fabricated based on a larger layout diagram which includes layout 200b. An intra-cell conductor is different than an input or an output pin. In the embodiment shown in FIG. 3C, the routing tracks RT2, RT3, and RT4 can be selected to generate the metallization patterns of M0 serving as dummy patterns, intra-cell wiring patterns, or other wiring patterns. For example, the routing tracks RT3 and RT4 can be selected to form metallization patterns 240-3 and 240-4. In other embodiments, one or more routing tracks can be selected to be free from formation of metallization patterns of M0.

Figure 4:
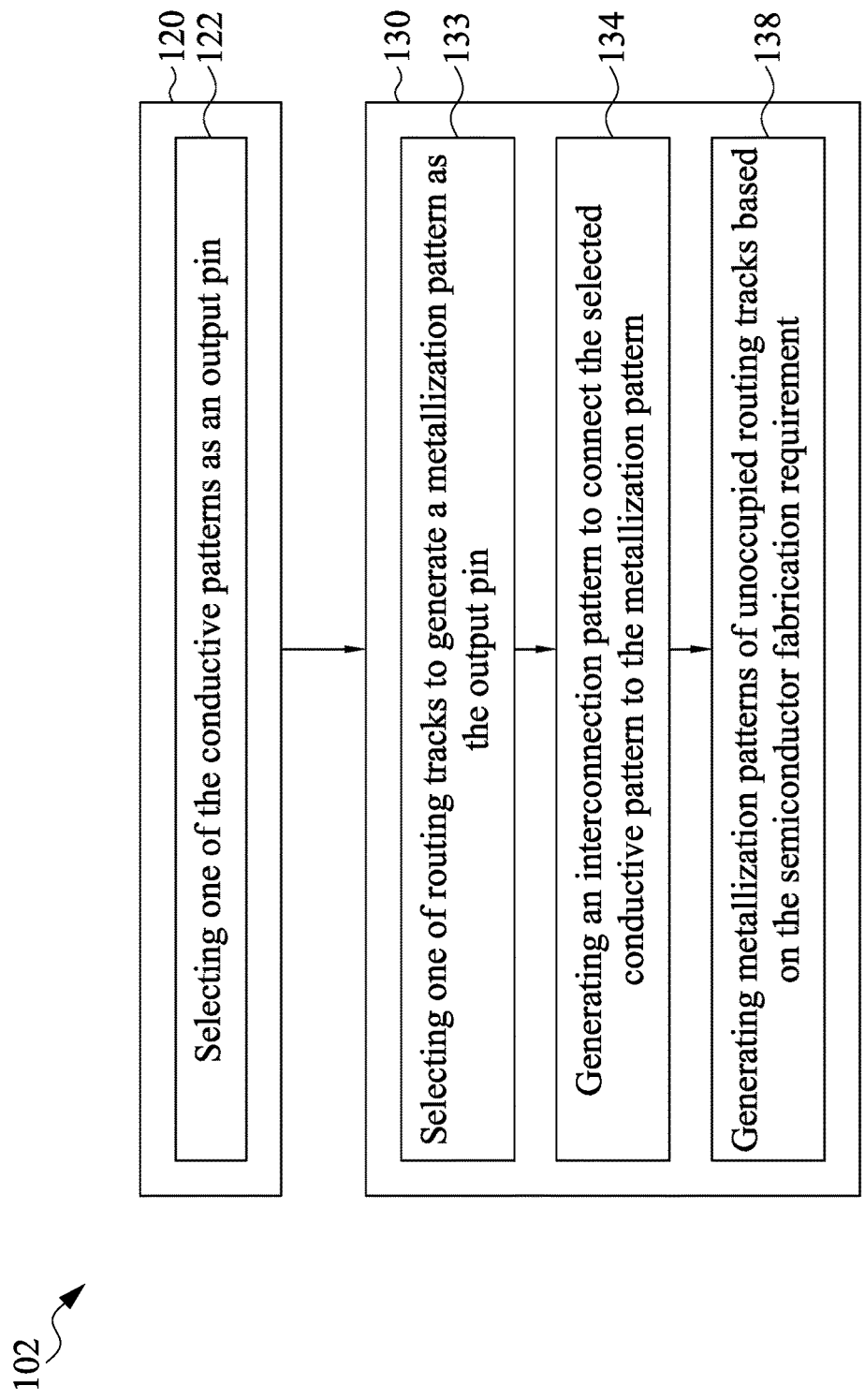
FIG. 4 is a flowchart of a method for manufacturing a layout of a semiconductor device according to various aspects of the present disclosure.

FIG. 4 is a flowchart of a method for manufacturing a layout of a semiconductor device according to various aspects of the present disclosure. More particularly, the method of FIG. 4 shows operations 120 and 130 of FIG. 2 in more detail, in accordance with one or more embodiments.

In some embodiments, operation 120 can include operation 122, and operation 130 can include operations 133, 134, and 138. In some embodiments, the operation 122 can include selecting at least one of the conductive patterns as an output pin. From operation 122, the flow proceeds to operation 133. In some embodiments, operation 133 can include selecting at least one of routing tracks to generate a metallization pattern of M0 as the output pin. In some embodiments, operation 134 can include generating an interconnection pattern to connect the selected conductive pattern and the metallization pattern of M0. From operation 134, the flow can proceed to operation 138.

Figure 4A:
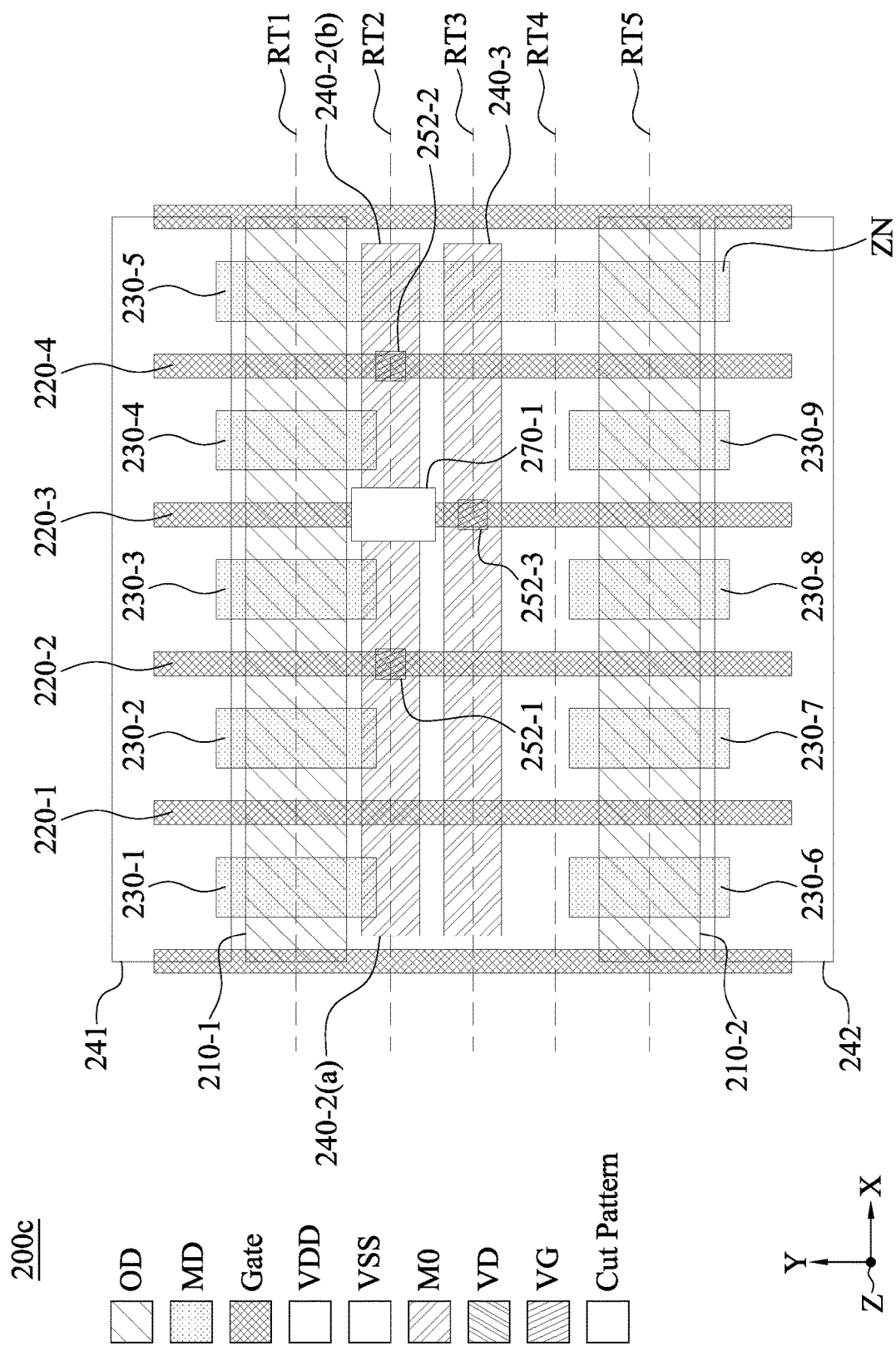
FIG. 4A, FIG. 4B, and FIG. 4C illustrate various stages of a manufacturing layout of a semiconductor device, in accordance with some embodiments of the present disclosure.
Figure 4B:
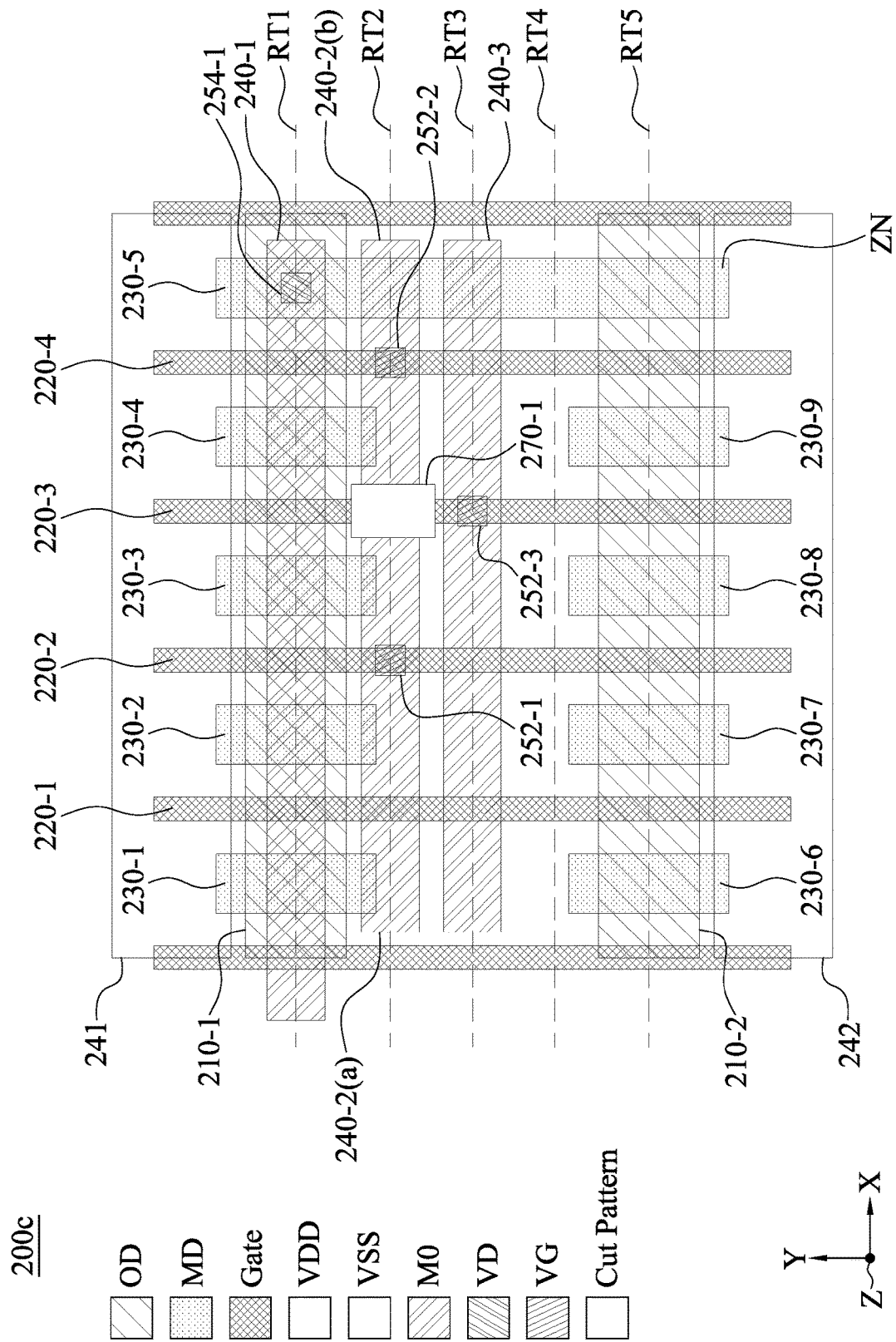
Figure 4C:
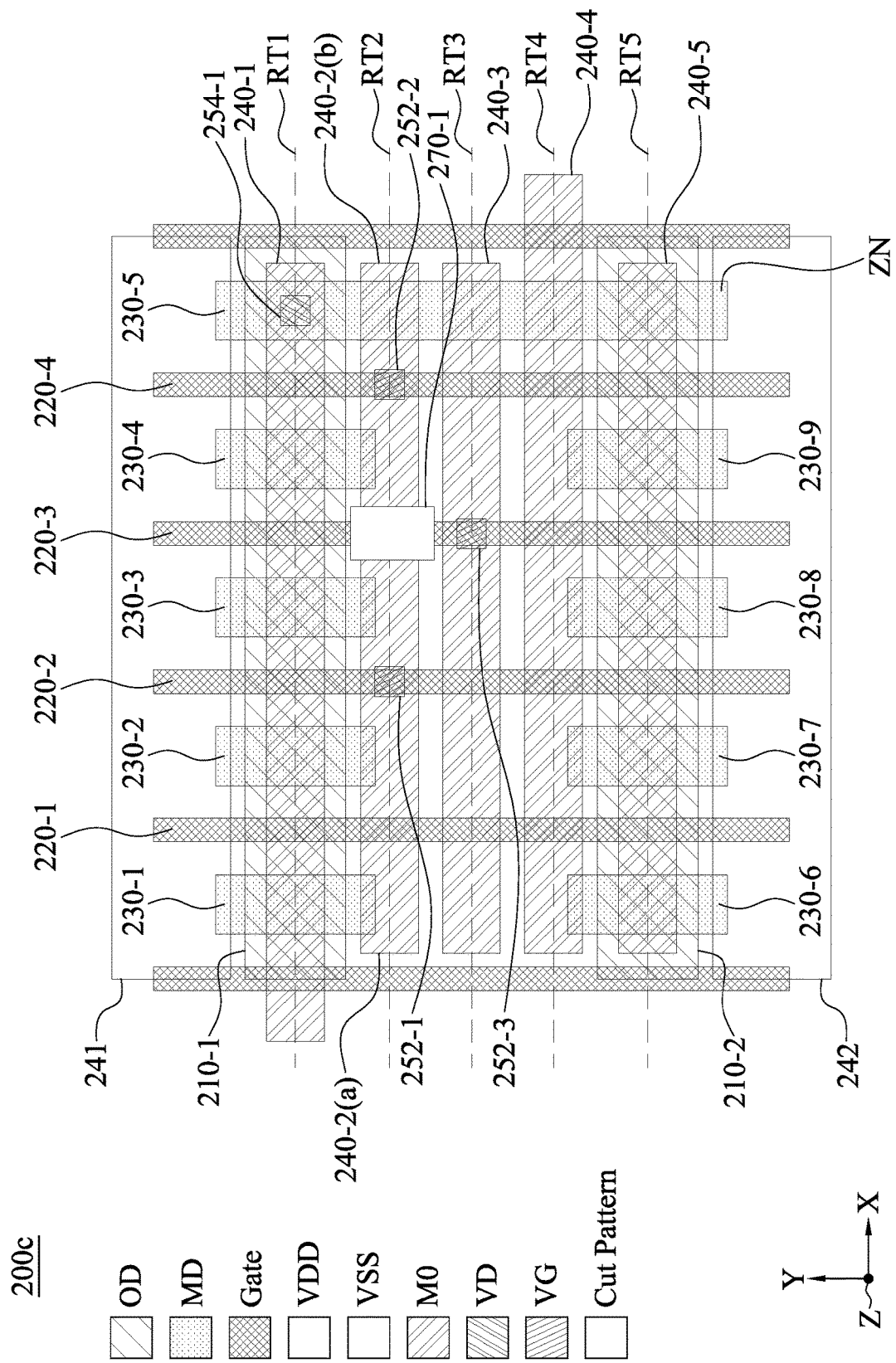

FIG. 4A, FIG. 4B, and FIG. 4C illustrate various stages of manufacturing a layout 200c of a semiconductor device corresponding to the method of FIG. 4, in accordance with some embodiments of the present disclosure.

Referring to FIG. 4A, in some embodiments, the input pins of gate patterns and some of the metallization patterns of M0 can be predetermined, contributing to output of the conductive patterns and some of the metallization patterns of M0 to be unrestricted. For example, the gate patterns 220-2, 220-3, and 220-4 may be selected as input pins. The routing tracks RT2 and RT3 are selected to form metallization patterns 240-2(a), 240-2(b) and 240-3 as input pins. The interconnection patterns 252-1, 252-2 and 252-3 are generated to connect the selected metallization patterns of M0 and gate patterns. Further, a cut pattern 270-1 can be generated to identify locations of metallization patterns 240-2(a) and 240-2(b), or identify locations of corresponding metallization layers of M0. In this embodiment, the output pin of the conductive pattern is not predetermined. In this embodiment, at least one of the conductive patterns 230-1 to 230-9 can be selected as an output pin. For example, the conductive pattern 230-5 can be selected as an output pin.

Referring to FIG. 4B, one of routing tracks RT1 to RT5 can be selected to generate a metallization pattern as the output pin in accordance with some embodiments. As shown in FIG. 4B, since all of the space of routing tracks RT2 and RT3 is utilized to form the metallization patterns 240-2(s), 240-2(b), and 240-3, one of the routing tracks RT1, RT4, and RT5 can be selected as the output pin. For example, the routing track RT1 can be selected to form the metallization pattern 240-1. Further, the interconnection pattern 254-1 can be generated accordingly to connect the selected conductive pattern 230-5 and metallization pattern 240-1.

Referring to FIG. 4C, metallization patterns of unoccupied routing tracks can be generated based on semiconductor fabrication requirements in accordance with some embodiments. After the formation of input and output pins of the metallization patterns of M0, the remaining space, which is not occupied by the input and output pins of the metallization patterns of M0, can be utilized to form metallization patterns of M0. In the embodiment shown in FIG. 4C, the routing tracks RT4 and RT5 can be selected to generate the metallization patterns of M0 serving as dummy patterns, intra-cell wiring patterns, or other wiring patterns. For example, the routing tracks RT4 and RT5 can be selected to form metallization patterns 240-4 and 240-5.

Figure 5:
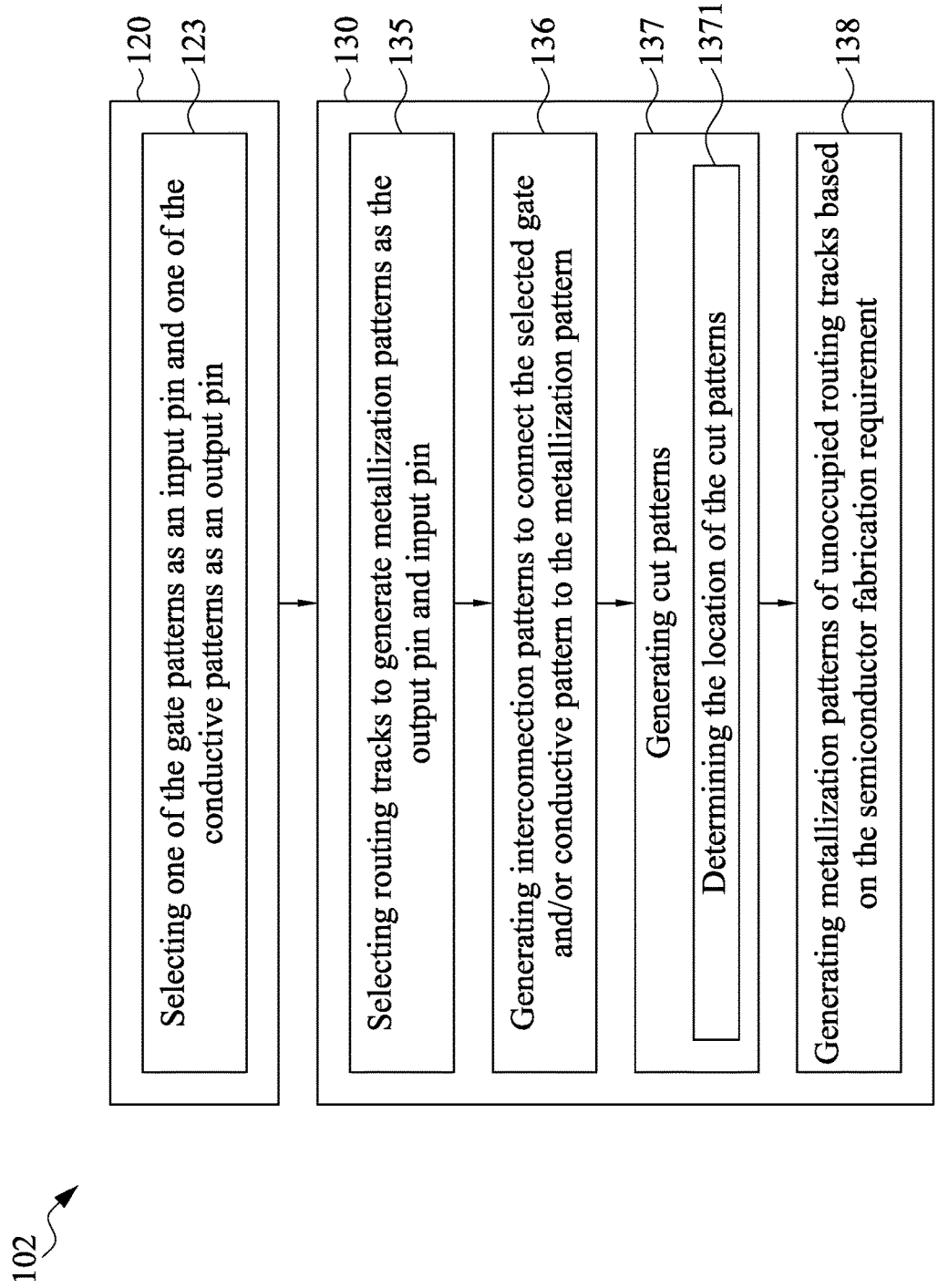
FIG. 5 is a flowchart of a method for manufacturing a layout of a semiconductor device according to various aspects of the present disclosure.

FIG. 5 is a flowchart of a method for manufacturing a layout of a semiconductor device according to various aspects of the present disclosure. More particularly, the method of FIG. 5 shows operations 120 and 130 of FIG. 2 in more detail, in accordance with one or more embodiments.

In some embodiments, operation 120 can include operation 123, and operation 130 can include operations 135, 136, 137 and 138. In some embodiments, the operation 123 can include selecting at least one of the gate patterns as an input pin and at least one of the conductive patterns as an output pin. From operation 123, the flow proceeds to operation 135. In some embodiments, operation 135 can include selecting routing tracks to generate metallization patterns as the output pin and input pin. In some embodiments, operation 136 can include generating interconnection patterns to connect the selected gate pattern to the metallization pattern, and connect the selected conductive pattern to the metallization pattern. In some embodiments, operation 137 can include generating cut pattern(s). In some embodiments, operation 137 can further include operation 1371 in which the locations of the cut pattern are determined. From operation 1371, the flow can proceed to operation 138.

Figure 5A:
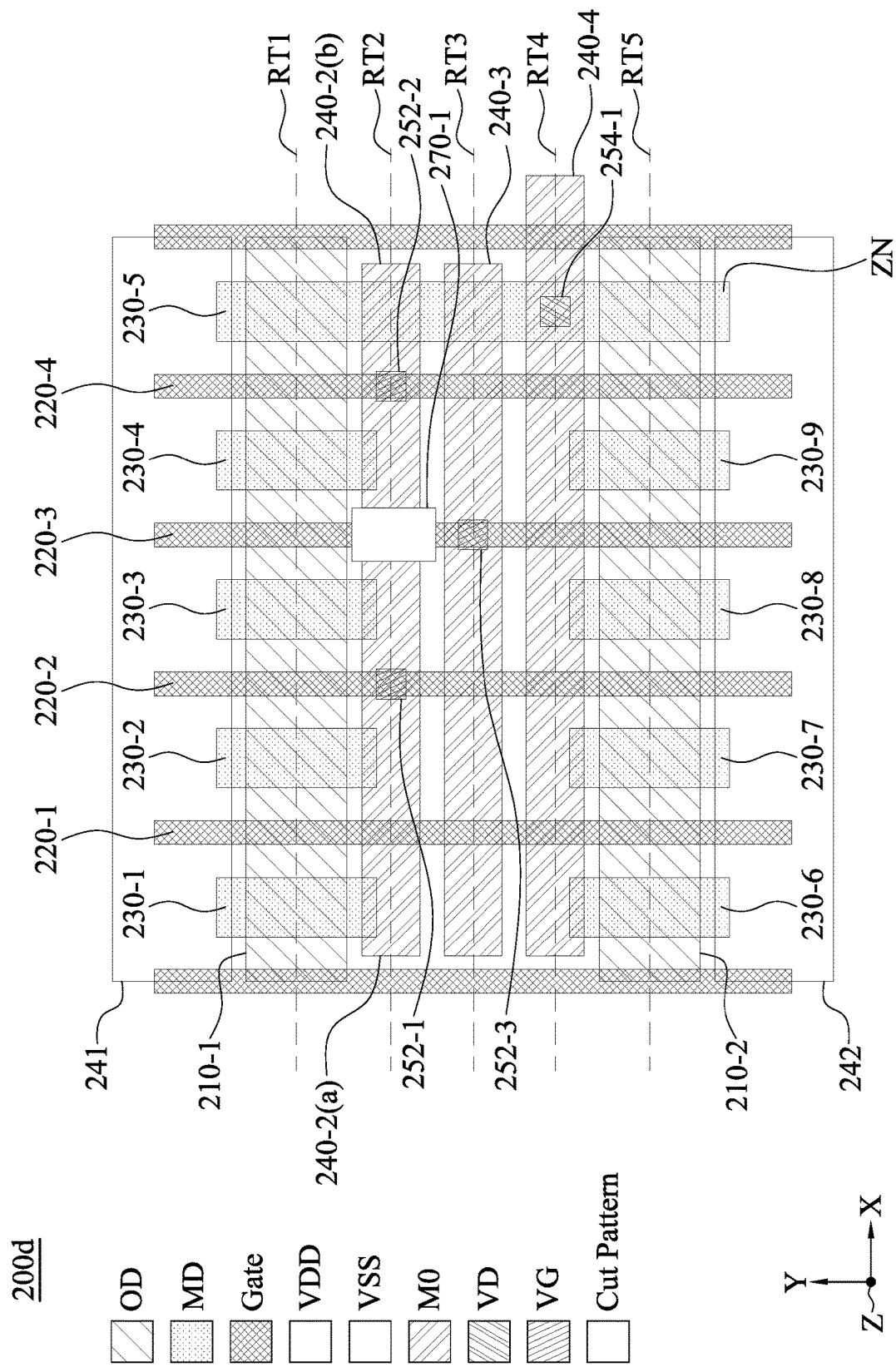
FIG. 5A and FIG. 5B illustrate various stages in the manufacture of a layout for a semiconductor device, in accordance with some embodiments of the present disclosure.
Figure 5B:
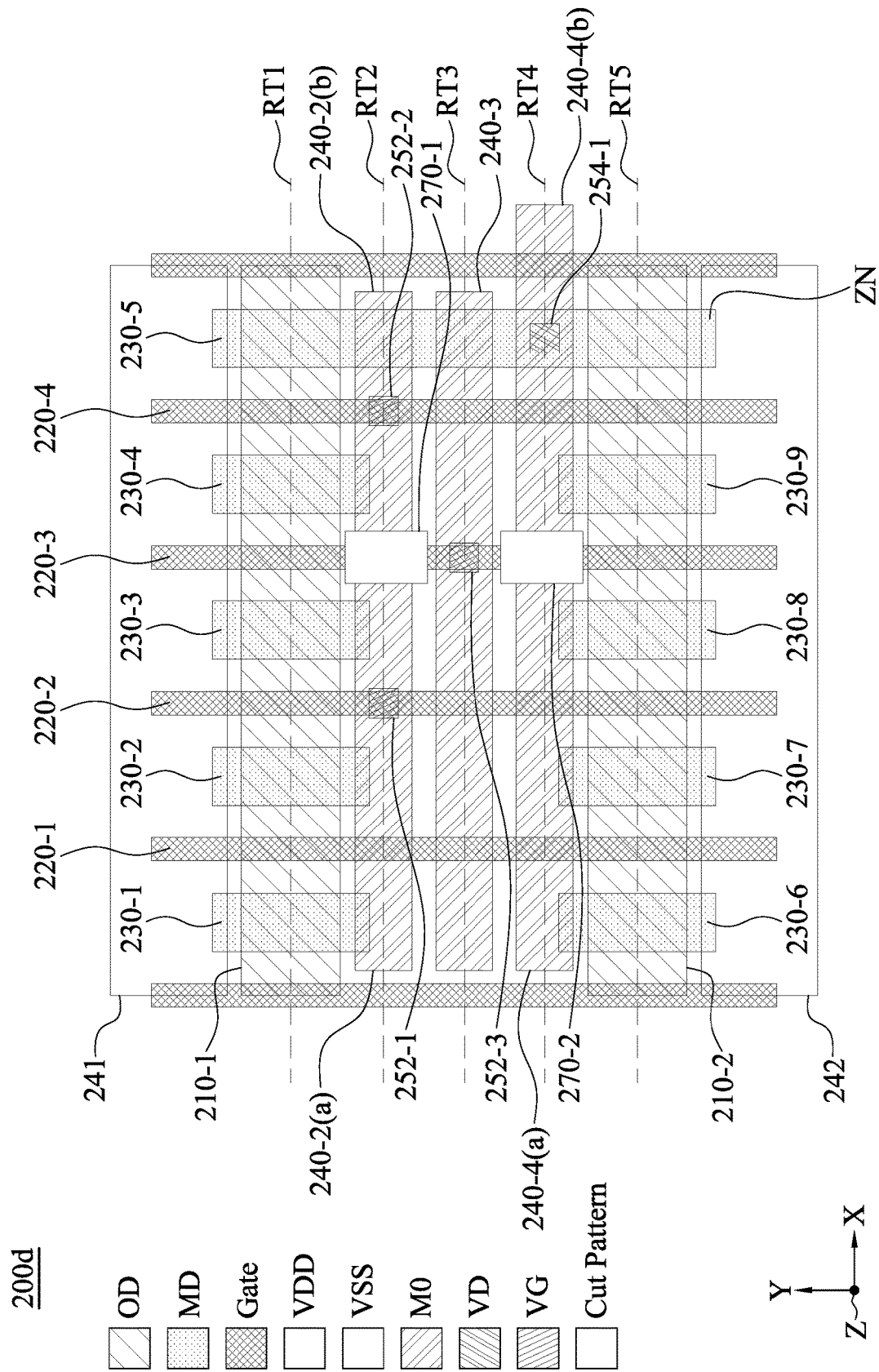

FIG. 5A and FIG. 5B illustrate various stages of manufacturing a layout 200*d* of a semiconductor device corresponding to the method of FIG. 5, in accordance with some embodiments of the present disclosure.

Referring to FIG. 5A, in some embodiments, the input pin(s) of gate patterns, the output pin(s) of the conductive pattern, and metallization patterns of M0 serving as the input and output pins, the interconnection patterns of the VG and VD can be predetermined, resulting in cutting pattern(s) being unrestricted. For example, the gate patterns 220-2, 220-3, and 220-4 may be selected as input pins. The routing tracks RT2 and RT3 are selected to form metallization patterns 240-2(*a*), 240-2(*b*) and 240-3 as input pins. The interconnection patterns 252-1, 252-2 and 252-3 are generated to connect the selected metallization patterns of M0 and gate patterns. A cut pattern 270-1 can be generated to identify locations of metallization patterns 240-2(*a*) and 240-2(*b*). Further, the conductive patterns 230-5 can be selected as an output pin. The routing track RT4 is selected to form metallization pattern 240-4 as an output pin. The interconnection pattern 254-1 is generated to connect the selected metallization patterns of M0 and conductive pattern.

Referring to FIG. 5B, a cut pattern 270-2 can be generated to form metallization patterns 240-4(*a*) and 240-4(*b*). In some embodiments, the location of the cut pattern 270-2 can be selected based on the selected gate and conductive patterns or on semiconductor fabrication requirements. As shown in FIG. 5B, the cut pattern 270-2, the gate pattern 220-3, and the metallization pattern 240-4 overlap so that the metallization pattern 240-4(*a*) can have the rightmost end at the gate pattern 220-3, and the metallization pattern 240-4(*b*) can have the leftmost end at the gate pattern 220-3. In other embodiments, the location of the cut pattern 270-2 can be selected to overlap other gate patterns or conductive patterns so that the locations and lengths of the metallization patterns 240-4(*a*) and 240-4(*b*) can be controlled. In this embodiment, the shape of the metallization patterns of M0 can be determined by the location of the cut pattern 270-2. In this embodiment, the length of the metallization patterns of M0 can be determined by the location of the cut pattern 270-2. In this embodiment, the interconnection patterns of the VG and VD are predetermined, resulting in the cut pattern being unrestricted.

Figure 6:
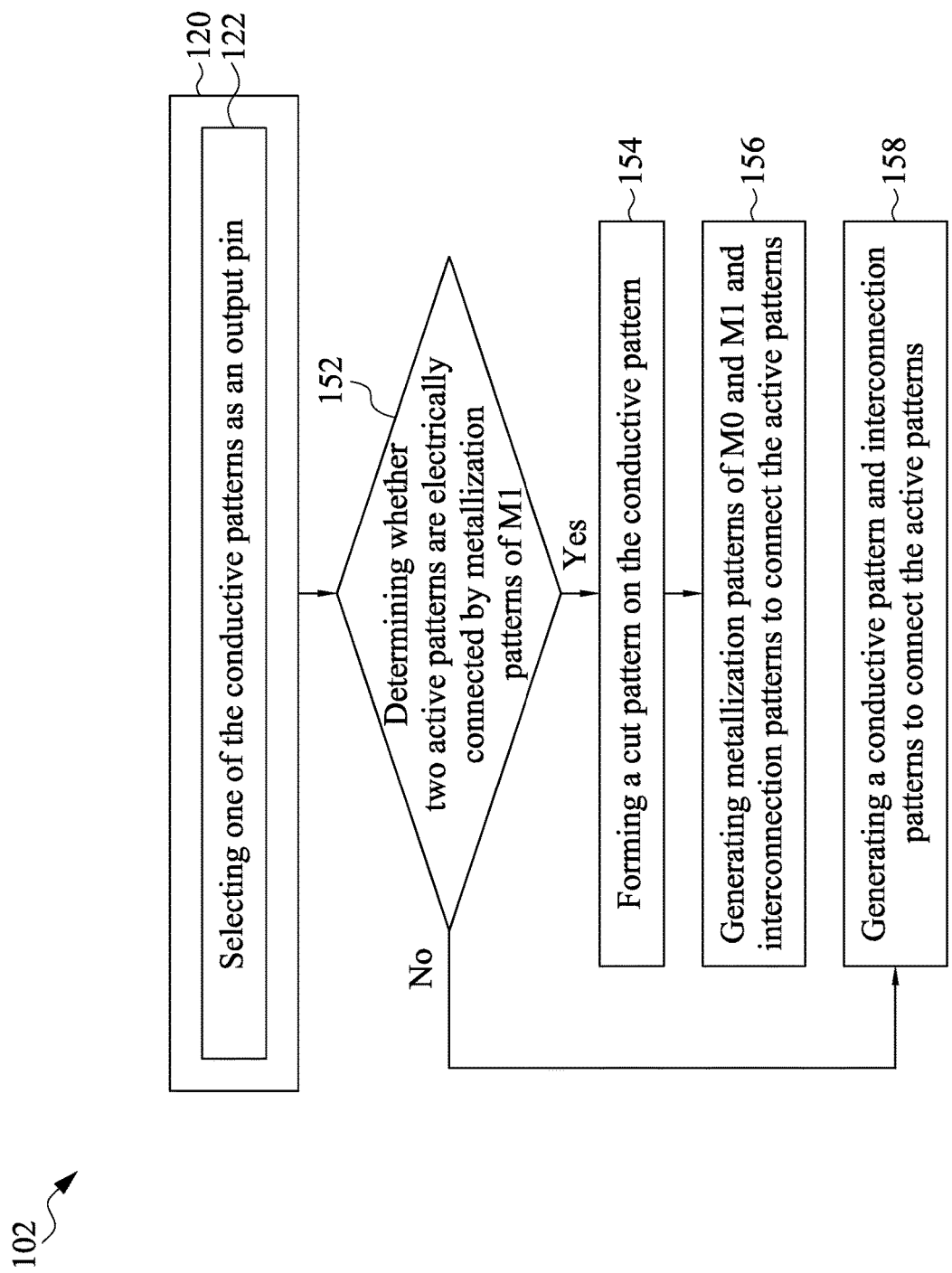
FIG. 6 is a flowchart of a method for manufacturing a layout of a semiconductor device according to various aspects of the present disclosure.

FIG. 6 is a flowchart of a method for manufacturing a semiconductor device according to various aspects of the present disclosure.

In some embodiments, operation 102 can include operations 122, 152, 154, 156, and 158. From operation 122, the flow can proceed to operation 152. In some embodiments, operation 152 can include determining whether two active patterns are connected by upper metallization patterns of M1 or higher metallization patterns rather than by metallization patterns of M0. Next, based on the determination of operation 152, operation 154 or 158 is performed. In some embodiments, when it is determined that two active patterns are connected by upper metallization patterns of M1 or higher metallization patterns, operations 154 and 156 are performed in order. In some embodiments, operation 154 can include forming a cut pattern on the conductive pattern. In some embodiments, operation 156 can include generating metallization patterns of M0 and M1 and interconnection patterns to connect the active patterns. In some embodiments, when it is determined that two active patterns are connected by metallization patterns of M0, operation 158 is performed. In some embodiments, operation 158 can include generating a conductive pattern and interconnection patterns to connect the active patterns.

Figure 6A:
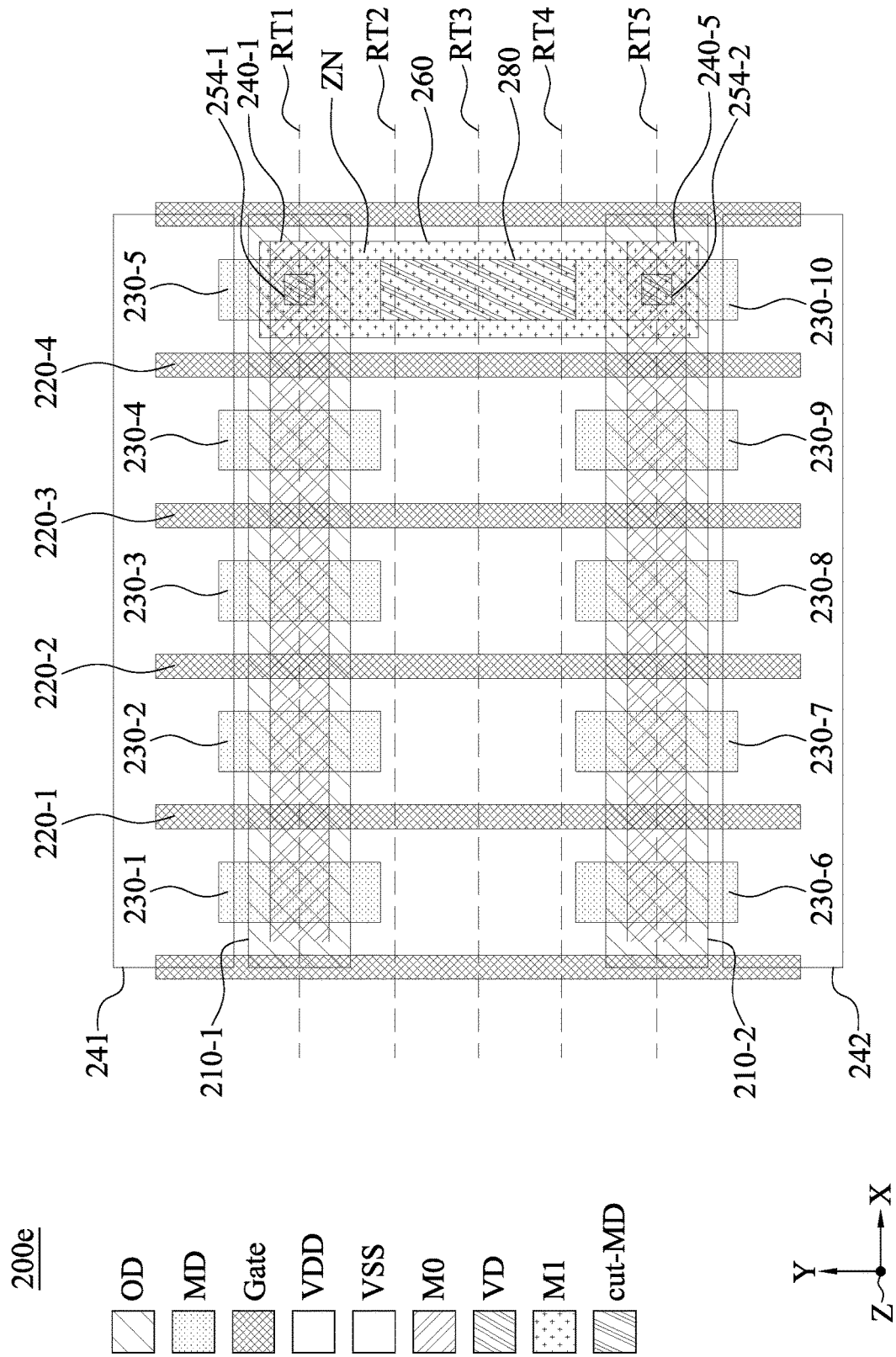
FIG. 6A and FIG. 6B illustrate various stages in the manufacture of a layout for a semiconductor device, in accordance with some embodiments of the present disclosure.
Figure 6B:
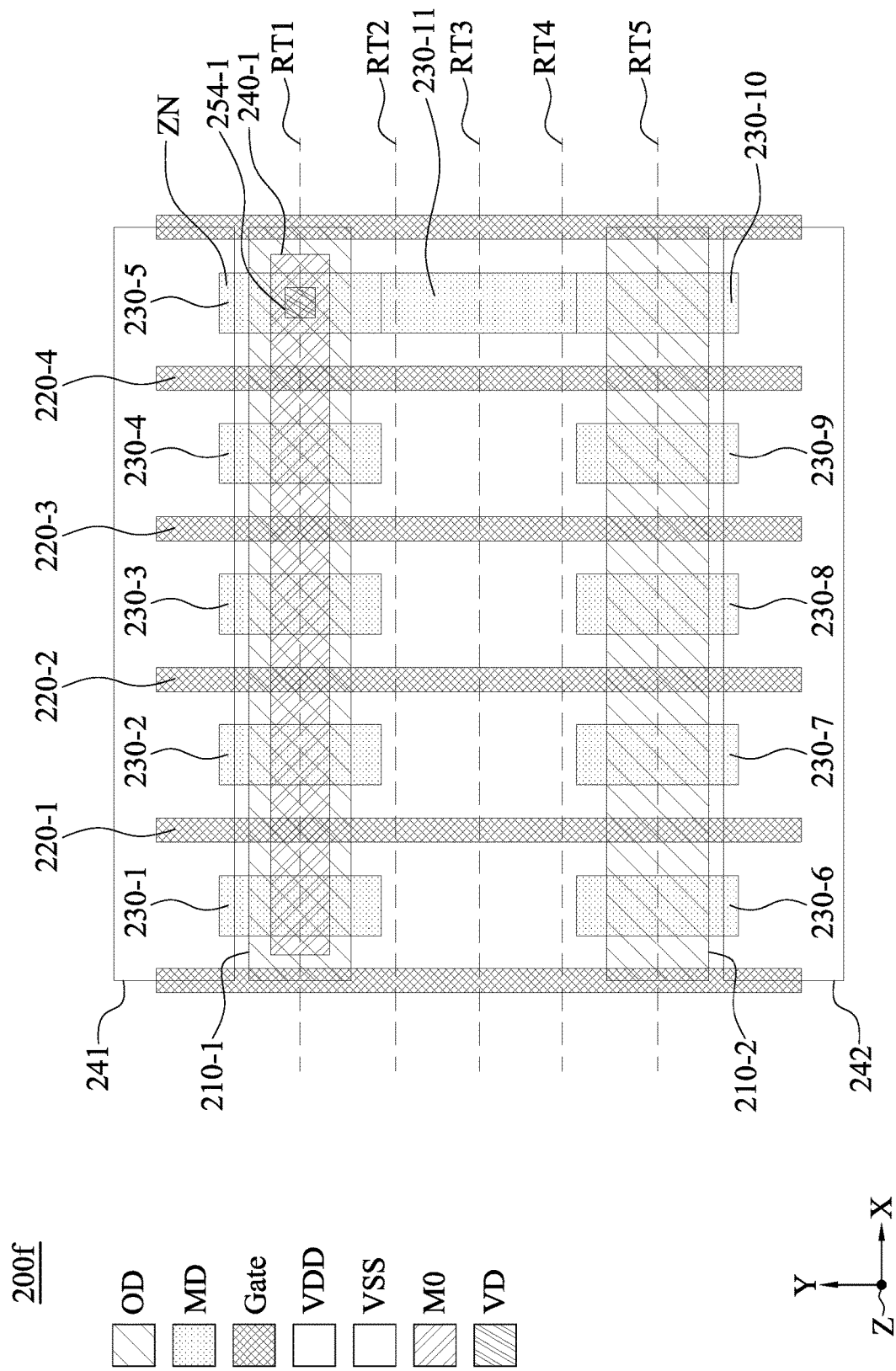

FIG. 6A and FIG. 6B illustrate various stages of manufacturing a layout 200*e* or 200*f* of a semiconductor device corresponding to the method of FIG. 6, in accordance with some embodiments of the present disclosure.

Referring to FIG. 6A, when it is determined that the active patterns 210-1 and 210-2 are connected by the metallization patterns of M1, a cut pattern 280 can be generated to define the locations of conductive patterns 230-5 and 230-10. The cut pattern 280 can be utilized to identify a length and location of the conductive patterns. The cut pattern 280 can also be referred to as "cut-MD." Interconnection patterns 254-1 and 254-2 can be generated accordingly. The routing tracks RT1 and RT5 can be selected to determine the shape of the metallization patterns 240-1 and 240-2. Further, an upper metallization pattern 260, such as the first metal layer (M1), is generated to connect the conductive patterns 230-5 and 230-10. Other interconnection patterns (not shown), connecting the conductive patterns 230-5 and 230-10 to the upper metallization pattern 260, can be generated. As a result, the active patterns 210-1 and 210-2 can be connected using the upper metallization pattern 260, thereby forming the layout 200*e*. In this embodiment, the upper metallization pattern 260 in M1 can be selected as an output pin.

Referring to FIG. 6B, when it is determined that two active patterns are connected using metallization patterns of MD, the cut pattern 280 shown in FIG. 6A can be omitted. The conductive patterns 230-5 and 230-10 can be connected through the conductive pattern 230-11. Interconnection pattern 254-1 can then be used to access the newly formed connection of conductive patterns 230-5, 230-10, and 230-11 from M0 layer by means of the metallization pattern 240-1. The routing track RT1 can be selected to determine the shape of the metallization pattern 240-1, thereby forming the layout 200*f*. In this embodiment, the conductive patterns 230-5, 230-10, and 230-11 can be selected as an output pin. In this embodiment, the metallization patterns 240-1 is flexible and can be located on different available routing tracks RT1-RT5. In this embodiment, the active patterns can also be selected as an output pin, allowing layout design of a semiconductor device to be more flexible.

Figure 7:
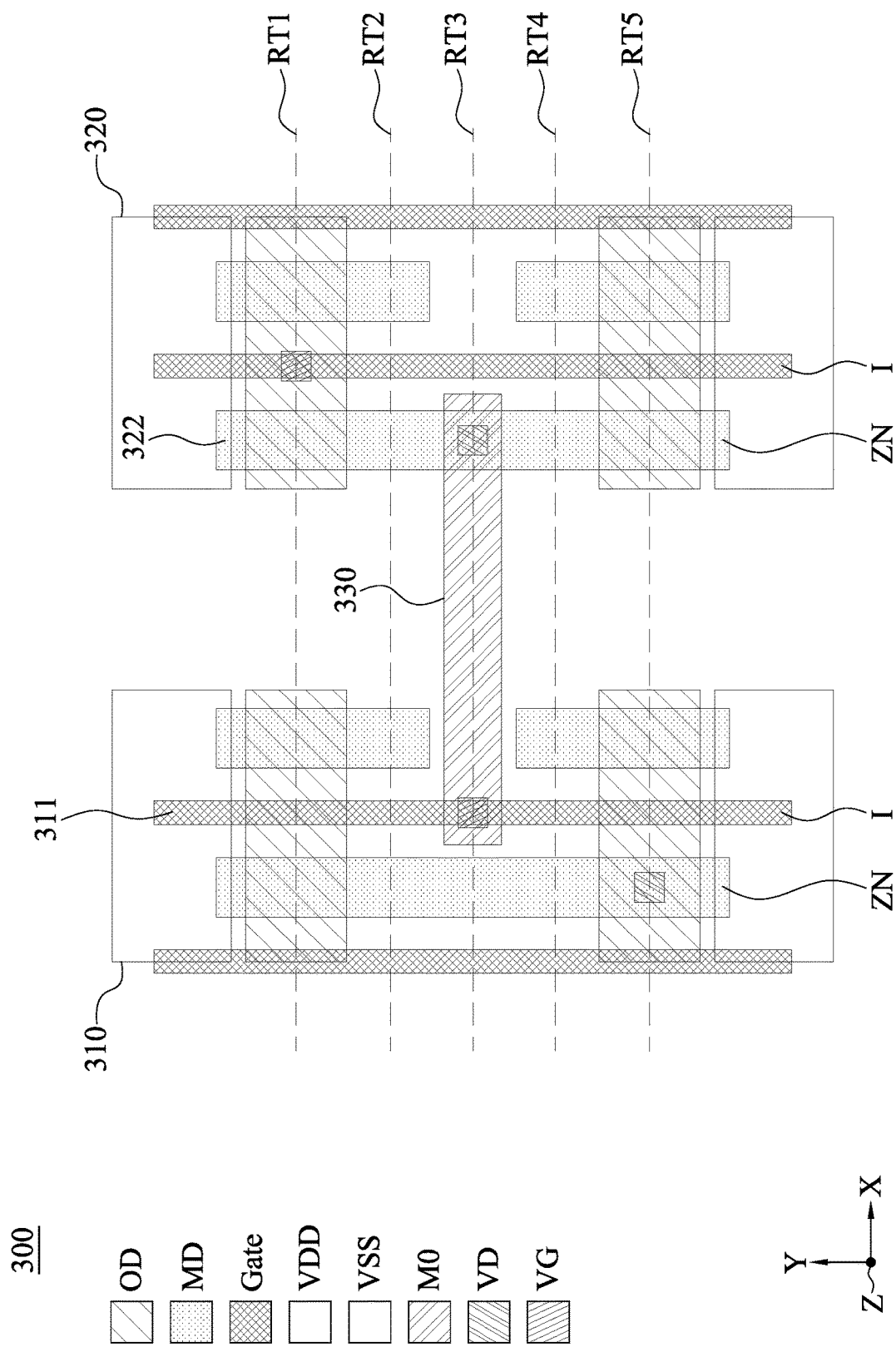
FIG. 7 is a top view of a portion of a semiconductor device, in accordance with some embodiments.

FIG. 7 is a top view of a layout 300 a semiconductor device, in accordance with some embodiments.

In some embodiments, the layout 300 can include cells 310 and 320. It should be noted that a portion of the cells 310 and 320 and some patterns therein have been omitted for brevity. In some embodiments, a gate pattern 311 within the cell 310 is selected as an input pin, and a conductive pattern 322 within the cell 320 is selected as an output pin. In some embodiments, the routing track RT3 can be selected to form a metallization pattern 330, which corresponds to the M0 of a semiconductor device, connecting the gate pattern 311 and the conductive pattern 322. In some embodiments, the metallization pattern 330 can extend continuously from the cell 310 to the cell 320. In some embodiments, the metallization pattern 330 can extend between the cells 310 and 320. In some embodiments, the metallization pattern 330 can extend across a space between the cells 310 and 320.

Figure 8:
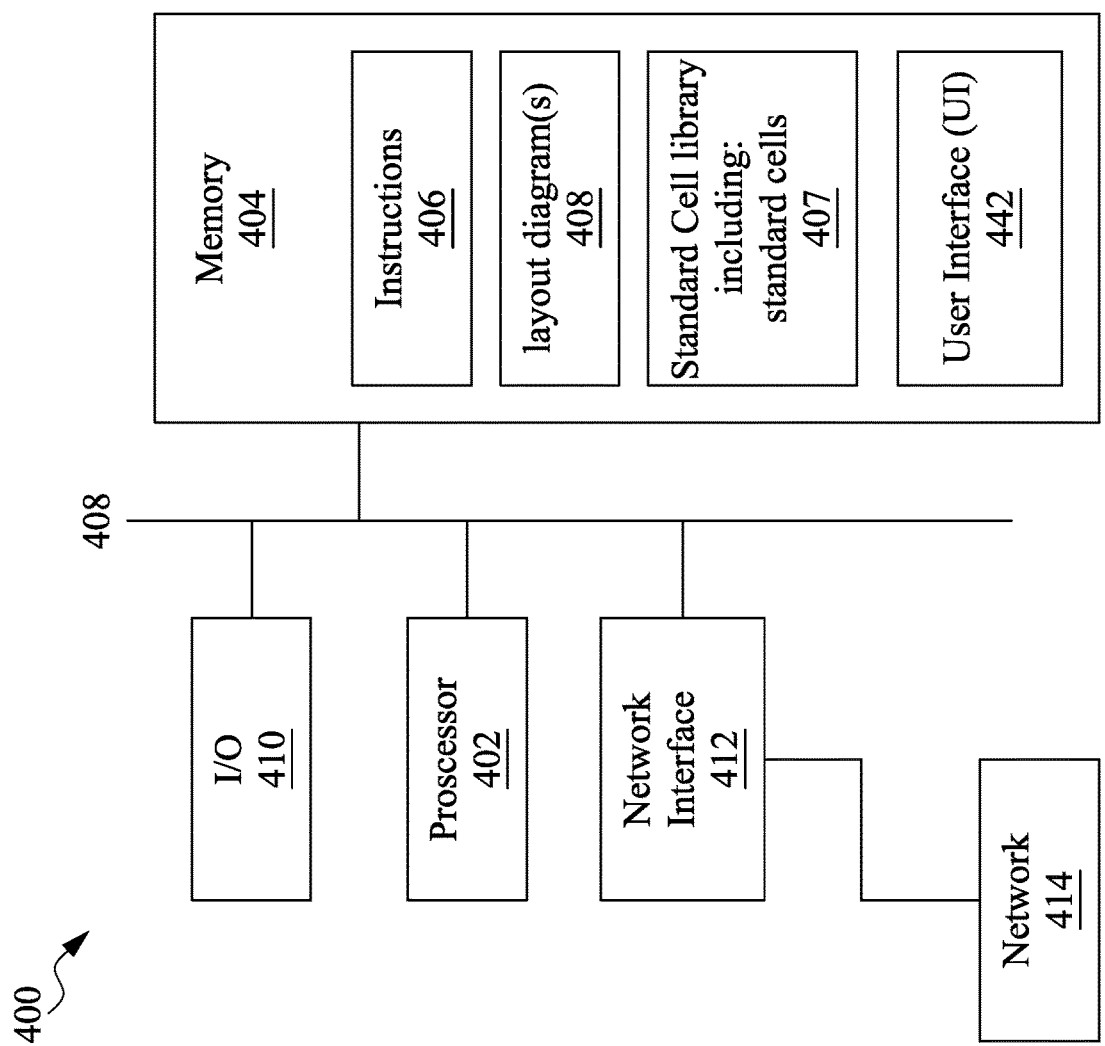
FIG. 8 is a block diagram of a system of designing a semiconductor device, in accordance with some embodiments.

FIG. 8 is a block diagram of a system 400 of designing a semiconductor device, in accordance with some embodiments. The system 400 can include, for example, an electronic design automation (EDA) system.

In some embodiments, system 400 includes an automatic placement and routing (APR) system. Methods described herein of generating PG layout diagrams, in accordance with one or more embodiments, are implementable, for example, using the system 400, in accordance with some embodiments.

In some embodiments, system 400 is a general purpose computing device including a hardware processor 402 and a non-transitory, computer-readable storage medium 404. Storage medium 404, amongst other things, is encoded with, i.e., stores, computer program code 406, i.e., a set of executable instructions. Execution of instructions 406 by hardware processor 402 represents (at least in part) an EDA tool which implements a portion or all of a method according to an embodiment, e.g., the methods described herein in accordance with one or more embodiments. (hereinafter, the noted processes and/or methods).

Processor 402 is electrically coupled to computer-readable storage medium 404 via a bus 408. Processor 402 is also electrically coupled to an I/O interface 410 by bus 408. A network interface 412 is also electrically connected to processor 402 via bus 408. Network interface 412 is connected to a network 414, so that processor 402 and computer-readable storage medium 404 are capable of connecting to external elements via network 414. Processor 402 is configured to execute computer program code 406 encoded in computer-readable storage medium 404 in order to cause system 400 to be usable for performing a portion or all of the noted processes and/or methods. In one or more embodiments, processor 402 is a central processing unit (CPU), a multi-processor, a distributed processing system, an application specific integrated circuit (ASIC), and/or a suitable processing unit.

In one or more embodiments, computer-readable storage medium 404 is an electronic, magnetic, optical, electromagnetic, infrared, and/or semiconductor system (or apparatus or device). For example, computer-readable storage medium 404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 404 includes a compact disk-read only memory (CD-ROM), a compact disk-read/write (CD-R/W), and/or a digital video disc (DVD).

In one or more embodiments, storage medium 404 stores computer program code (instructions) 406 configured to cause system 400 (where such execution represents (at least in part) the EDA tool) to be usable for performing a portion or all of the noted processes and/or methods. In one or more embodiments, storage medium 404 also stores information which facilitates performing a portion or all of the noted processes and/or methods. In one or more embodiments, storage medium 404 stores library 407 of standard cells including such standard cells as disclosed herein and one or more layout diagrams 408 such as are disclosed herein.

System 400 includes I/O interface 410. I/O interface 410 is coupled to external circuitry. In one or more embodiments, I/O interface 410 includes a keyboard, keypad, mouse, trackball, trackpad, touchscreen, and/or cursor direction keys for communicating information and commands to processor 402.

System 400 also includes network interface 412 coupled to processor 402. Network interface 412 allows system 400 to communicate with network 414, to which one or more other computer systems are connected. Network interface 412 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 400.

System 400 is configured to receive information through I/O interface 410. The information received through I/O interface 410 includes one or more of instructions, data, design rules, libraries of standard cells, and/or other parameters for processing by processor 402. The information is transferred to processor 402 via bus 408. System 400 is configured to receive information related to a UI through I/O interface 410. The information is stored in computer-readable medium 404 as user interface (UI) 442.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods are implemented as a software application running on System 400. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
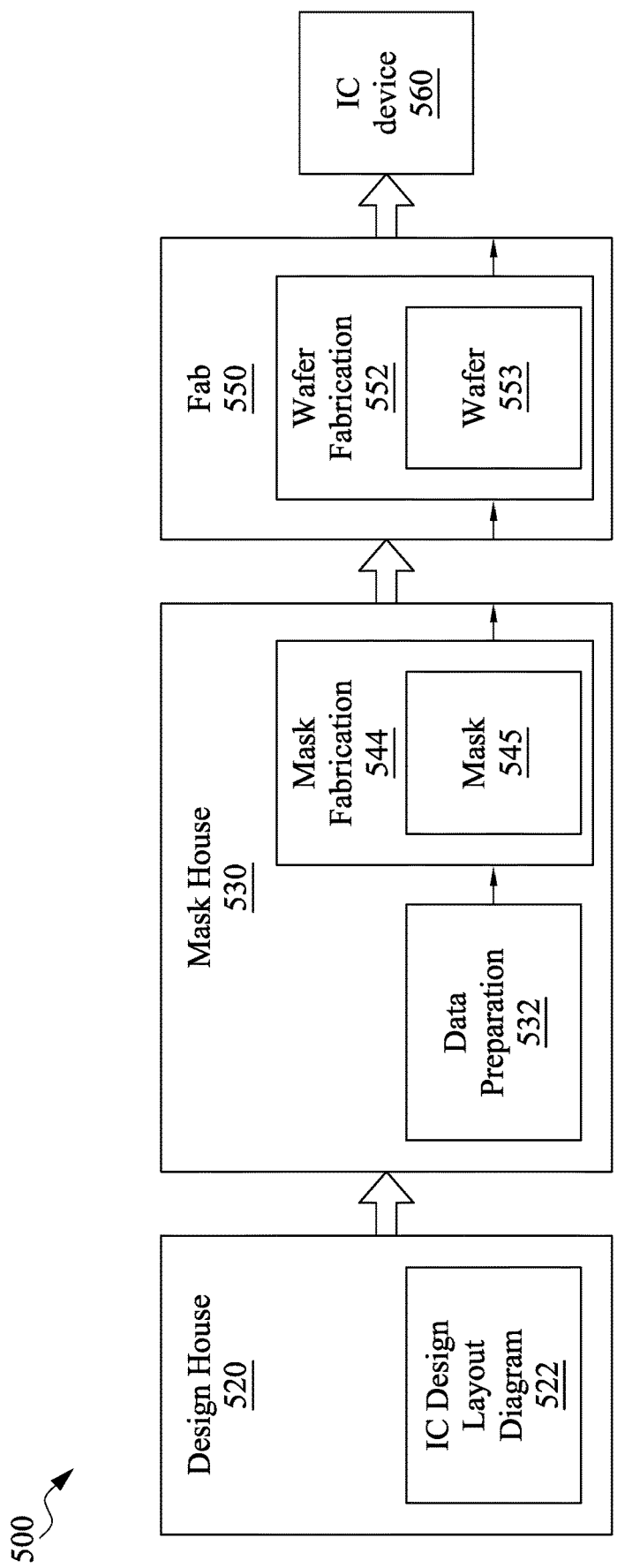
FIG. 9 is a block diagram of a semiconductor device manufacturing system, and a semiconductor device flow associated therewith, in accordance with some embodiments.

FIG. 9 is a block diagram of a semiconductor device manufacturing system 500, and a semiconductor device flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 500.

In FIG. 9, IC manufacturing system 500 includes entities, such as a design house 520, a mask house 530, and an IC manufacturer/fabricator ("fab") 550, that interact with one another in the design, development, and manufacturing cycles and/or services related to manufacturing an IC device 560. The entities in system 500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 520, mask house 530, and IC fab 550 is owned by a single larger company. In some embodiments, two or more of design house 520, mask house 530, and IC fab 550 coexist in a common facility and use common resources.

Design house (or design team) 520 generates an IC design layout diagram 522. IC design layout diagram 522 includes various geometrical patterns designed for an IC device 560.

The geometrical patterns correspond to patterns of metal, oxide, or semiconductor layers that make up the various components of IC device 560 to be fabricated. The various layers combine to form various IC features. For example, a portion of IC design layout diagram 522 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 520 implements a proper design procedure to form IC design layout diagram 522. The design procedure includes one or more of logic design, physical design or place and route. IC design layout diagram 522 is presented in one or more data files having information of the geometrical patterns. For example, IC design layout diagram 522 can be expressed in a GDSII file format or DFII file format.

Mask house 530 includes data preparation 532 and mask fabrication 544. Mask house 530 uses IC design layout diagram 522 to manufacture one or more masks 545 to be used for fabricating the various layers of IC device 560 according to IC design layout diagram 522. Mask house 530 performs mask data preparation 532, where IC design layout diagram 522 is translated into a representative data file ("RDF"). Mask data preparation 532 provides the RDF to mask fabrication 544. Mask fabrication 544 includes a mask writer. A mask writer converts the RDF to an image on a substrate, such as a mask (reticle) 545 or a semiconductor wafer 553. The design layout diagram 522 is manipulated by mask data preparation 532 to comply with particular characteristics of the mask writer and/or requirements of IC fab 550. In FIG. 9, mask data preparation 532 and mask fabrication 544 are illustrated as separate elements. In some embodiments, mask data preparation 532 and mask fabrication 544 can be collectively referred to as mask data preparation.

In some embodiments, mask data preparation 532 includes optical proximity correction (OPC) which uses lithography enhancement techniques to compensate for image errors, such as those that can arise from diffraction, interference, other process effects and the like. OPC adjusts IC design layout diagram 522. In some embodiments, mask data preparation 532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 532 includes a mask rule checker (MRC) that checks the IC design layout diagram 522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 522 to compensate for limitations during mask fabrication 544, which may undo part of the modifications performed by OPC in order to meet mask creation rules.

In some embodiments, mask data preparation 532 includes lithography process checking (LPC) that simulates processing that will be implemented by IC fab 550 to fabricate IC device 560. LPC simulates this processing based on IC design layout diagram 522 to create a simulated manufactured device, such as IC device 560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 522.

It should be understood that the foregoing description of mask data preparation 532 has been simplified for the purposes of clarity. In some embodiments, data preparation 532 includes additional features such as a logic operation (LOP) to modify the IC design layout diagram 522 according to manufacturing rules. Additionally, the processes applied to IC design layout diagram 522 during data preparation 532 may be executed in a variety of different orders.

After mask data preparation 532 and during mask fabrication 544, a mask 545 or a group of masks 545 are fabricated based on the modified IC design layout diagram 522. In some embodiments, mask fabrication 544 includes performing one or more lithographic exposures based on IC design layout diagram 522. In some embodiments, an electron-beam (e-beam) or a mechanism of multiple e-beams is used to form a pattern on a mask (photomask or reticle) 545 based on the modified IC design layout diagram 522. Mask 545 can be formed in various technologies. In some embodiments, mask 545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 545 includes a transparent substrate (e.g., fused quartz) and an opaque material (e.g., chromium) coated in the opaque regions of the binary mask. In another example, mask 545 is formed using a phase shift technology. In a phase shift mask (PSM) version of mask 545, various features in the pattern formed on the phase shift mask are configured to have proper phase difference to enhance the resolution and imaging quality. In various examples, the phase shift mask can be attenuated PSM or alternating PSM. The masks generated by mask fabrication 544 are used in a variety of processes. For example, such a mask(s) can be used in an ion implantation process to form various doped regions in semiconductor wafer 553, in an etching process to form various etching regions in semiconductor wafer 553, and/or in other suitable processes.

IC fab 550 includes wafer fabrication 552. IC fab 550 is an IC fabricator that includes one or more manufacturing facilities for the fabrication of a variety of different IC products. In some embodiments, IC Fab 550 can be a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 550 uses mask(s) 545 fabricated by mask house 530 to fabricate IC device 560. Thus, IC fab 550 at least indirectly uses IC design layout diagram 522 to fabricate IC device 560. In some embodiments, semiconductor wafer 553 is fabricated by IC fab 550 using mask(s) 545 to form IC device 560. In some embodiments, the IC fabrication includes performing one or more lithographic exposures based at least indirectly on IC design layout diagram 522. Semiconductor wafer 553 includes a silicon substrate or other proper substrate having material layers formed thereon. Semiconductor wafer 553 further includes one or more of various doped regions, dielectric features, multi-level interconnects, and the like (formed at subsequent manufacturing steps).

Details regarding an integrated circuit (IC) manufacturing system (e.g., system 500 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

Some embodiments of the present disclosure provide a method of arranging patterns of a semiconductor device. The method includes generating a plurality of gate patterns corresponding to a set of gate structures of the semiconductor device and a plurality of conductive patterns corresponding to a set of metal diffusion (MD) conductive features of the semiconductor device. Each of the plurality of gate patterns and conductive patterns is located at a first horizontal level and extends along a first direction. The method also includes selecting one of the gate patterns as an input pin or one of the conductive patterns as an output pin. The method further includes generating, based on a selected gate pattern or a selected conductive pattern, a plurality of metallization patterns corresponding to a set of first metallization layers of the semiconductor device. Each of the plurality of metallization patterns is located at a second horizontal level overlying the first horizontal level and extends along a second direction substantially perpendicular to the first direction.

Some embodiments of the present disclosure provide a system for arranging patterns of a semiconductor device. The system includes at least one processing unit and at least one memory including computer program code for one or more programs. The at least one memory, the computer program code and the at least one processing unit are configured to cause the system to perform: generating a plurality of gate patterns corresponding to a set of gate structures of the semiconductor device and a plurality of conductive patterns corresponding to a set of metal diffusion (MD) conductive features of the semiconductor device, wherein each of the plurality of gate patterns and conductive patterns is located at a first horizontal level and extends along a first direction; selecting one of the gate patterns as an input pin or one of the conductive patterns as an output pin; and generating, based on a selected gate pattern or a selected conductive pattern, a plurality of metallization patterns corresponding to a set of first metallization layers of the semiconductor device, wherein each of the plurality of metallization patterns is located at a second horizontal level overlying the first horizontal level and extends along a second direction substantially perpendicular to the first direction.

Some embodiments of the present disclosure provide a semiconductor device. The semiconductor device includes a first cell. The first cell includes a plurality of gate structures, metal diffusion (MD)) conductive features, and first metallization layers. The gate structures are located at a first horizontal level and extend along a first direction. The MD conductive features are located at the first horizontal level and extend along the first direction. The first metallization layers are located at a second horizontal level overlying the first horizontal level and extend along a second direction substantially orthogonal to the first direction. At least one of the first metallization layers is electrically connected to one of the plurality of gate structures or one of the MD conductive features through a conductive via. The plurality of first metallization layers includes a first metallization layer with a first length along the second direction and a second metallization layer with a second length, along the second direction, different from the first length.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of arranging patterns of a semiconductor device, the method comprising:
    generating a plurality of gate patterns corresponding to a set of gate structures of the semiconductor device and a plurality of conductive patterns corresponding to a set of metal diffusion (MD) conductive features of the semiconductor device, wherein each of the plurality of gate patterns and conductive patterns is located at a first horizontal level and extends along a first direction;
    selecting one of the gate patterns as an input pin or one of the conductive patterns as an output pin; and
    generating, based on a selected gate pattern or a selected conductive pattern, a plurality of metallization patterns corresponding to a set of first metallization layers of the semiconductor device, wherein each of the plurality of metallization patterns is located at a second horizontal level overlying the first horizontal level and extends along a second direction substantially perpendicular to the first direction.

2. The method of claim 1, further comprising generating a first interconnection pattern corresponding to a conductive via connected to the gate structure of the semiconductor device, wherein the first interconnection pattern is located at a third horizontal level between the first horizontal level and the second horizontal level, and the first interconnection pattern overlaps one of the metallization patterns and the selected gate pattern along a third direction substantially orthogonal to the first direction and the second direction.

3. The method of claim 1, further comprising generating a second interconnection pattern corresponding to a conductive via connected to the MD conductive feature of the semiconductor device, wherein the second interconnection pattern is located at a third horizontal level between the first horizontal level and the second horizontal level, and the second interconnection pattern overlaps one of the metallization patterns and the selected conductive pattern along a third direction substantially orthogonal to the first direction and the second direction.

4. The method of claim 1, wherein generating the plurality of metallization patterns comprises:
    generating a first metallization pattern with a first length along the second direction; and generating a second metallization pattern with a second length different from the first length along the second direction, wherein the first metallization pattern and the second metallization pattern are arranged along the first direction.

5. The method of claim 1, wherein the semiconductor device comprises a first cell and a second cell, the plurality of gate patterns and the plurality of conductive patterns are located within the first cell, and generating the plurality of metallization patterns comprises generating a third metallization pattern extending continuously from the first cell to the second cell to connect the input pin of the first cell to an output pin of the second cell.

6. The method of claim 1, wherein generating the plurality of metallization patterns comprises generating, based on the selected gate pattern and the selected conductive pattern, a first cut pattern at the second horizontal level, wherein the first cut pattern overlaps one of the first metallization layers, and the first cut pattern is utilized to identify a location of one the first metallization layers of the semiconductor device.

7. The method of claim 6, wherein the first cut pattern is further utilized to identify a length, along the second direction, of one of the first metallization layers of the semiconductor device.

8. The method of claim 1, further comprising:
generating a first active pattern and a second active pattern, wherein each of the first active pattern and the second active pattern corresponds to an active region of the semiconductor device; and
determining whether the first active pattern and the second active pattern are electrically connected through the conductive pattern; and
generating, in response to the first active pattern and the second active pattern are electrically connected through the conductive pattern, one of metallization patterns to connect the conductive pattern.

9. The method of claim 1, wherein the patterns of the semiconductor device comprise a plurality of routing tracks extending along the second direction, and the plurality of routing tracks is configured to define locations of the plurality of metallization patterns, and generating the plurality of metallization patterns comprises:
selecting one of routing tracks to generate at least one metallization pattern to occupy at least a portion of the one of routing tracks;
generating an interconnection pattern configured to connect the at least one metallization pattern and the selected gate pattern or the selected conductive pattern; and
generating the plurality of metallization patterns to occupy at least a portion of unoccupied routing tracks.

10. A system for arranging patterns of a semiconductor device, comprising:
at least one processing unit; and
at least one memory including computer program code for one or more programs;
wherein the at least one memory, the computer program code and the at least one processing unit are configured to cause the system to perform:
generating a plurality of gate patterns corresponding to a set of gate structures of the semiconductor device and a plurality of conductive patterns corresponding to a set of metal diffusion (MD) conductive features of the semiconductor device, wherein each of the plurality of gate patterns and conductive patterns is located at a first horizontal level and extends along a first direction;
selecting one of the gate patterns as an input pin or one of the conductive patterns as an output pin; and
generating, based on a selected gate pattern or a selected conductive pattern, a plurality of metallization patterns corresponding to a set of first metallization layers of the semiconductor device, wherein each of the plurality of metallization patterns is located at a second horizontal level overlying the first horizontal level and extends along a second direction substantially perpendicular to the first direction.

11. The system of claim 10, wherein the at least one memory, the computer program code and the at least one processing unit are further configured to cause the system to generate a first interconnection pattern corresponding to a conductive via connected to the gate structure of the semiconductor device, wherein the first interconnection pattern is located at a third horizontal level between the first horizontal level and the second horizontal level, and the first interconnection pattern overlaps one of the metallization patterns and the selected gate pattern along a third direction substantially orthogonal to the first direction and the second direction.

12. The system of claim 10, wherein the at least one memory, the computer program code and the at least one processing unit are further configured to cause the system to generate a second interconnection pattern corresponding to a conductive via connected to the MD conductive feature of the semiconductor device, wherein the second interconnection pattern is located at a third horizontal level between the first horizontal level and the second horizontal level, and the second interconnection pattern overlaps one of the metallization patterns and the selected conductive pattern along a third direction substantially orthogonal to the first direction and the second direction.

13. The system of claim 10, wherein generating the plurality of metallization patterns comprises:
generating a first metallization pattern with a first length along the second direction; and
generating a second metallization pattern with a second length different from the first length along the second direction, wherein the first metallization pattern and the second metallization pattern are arranged along the first direction.

14. The system of claim 10, wherein the semiconductor device comprises a first cell and a second cell, the plurality of gate patterns and the plurality of conductive patterns are located within the first cell, and the at least one memory, the computer program code and the at least one processing unit are further configured to cause the system to generate a third metallization pattern extending continuously from the first cell to the second cell to connect the input pin of the first cell to an output pin of the second cell.

15. The system of claim 10, wherein the at least one memory, the computer program code and the at least one processing unit are further configured to cause the system to generate, based on the selected gate pattern and the selected conductive pattern, a first cut pattern at the second horizontal level, wherein the first cut pattern overlaps one of the first metallization layers, and the first cut pattern is utilized to identify a location of one of the first metallization layers of the semiconductor device.

16. The system of claim 15, wherein the cut pattern is further utilized to identify a length, along the second direction, of one of the first metallization layers of the semiconductor device.

17. The system of claim 10, wherein the at least one memory, the computer program code and the at least one processing unit are further configured to cause the system to perform:
   generating a first active pattern and a second active pattern, wherein each of the first active pattern and the second active pattern corresponds to an active region of the semiconductor device; and
   determining whether the first active pattern and the second active pattern are electrically connected through an upper metallization pattern, wherein the upper metallization pattern extending from the first active pattern to the second active pattern, the upper metallization pattern corresponds to a second metallization layer of the semiconductor device, the upper metallization pattern is located at a fourth horizontal level overlying the second horizontal level and extends along the first direction; and
   generating, in response to the first active pattern and the second active pattern are electrically connected through an upper metallization pattern, a second cut pattern at the first horizontal level, wherein the second cut pattern overlaps one of the conductive patterns, and the second cut pattern is utilized to identify a length of one the conductive patterns of the semiconductor device.

18. The system of claim 10, wherein the patterns of the semiconductor device comprise a plurality of routing tracks extending along the second direction, and the plurality of routing tracks is configured to define locations of the plurality of metallization patterns, and wherein the at least one memory, the computer program code and the at least one processing unit are further configured to cause the system to perform:
   selecting one of routing tracks to generate at least one metallization pattern to occupy at least a portion of the one of routing tracks;
   generating an interconnection pattern configured to connect the at least one metallization pattern and the selected gate pattern or the selected conductive pattern; and
   generating the plurality of metallization patterns to occupy at least a portion of unoccupied routing tracks.

19. A semiconductor device, comprising:
   a first cell, comprising:
      a plurality of gate structures located at a first horizontal level and extending along a first direction;
      a plurality of metal diffusion (MD) conductive features located at the first horizontal level and extending along the first direction; and
      a plurality of first metallization layers located at a second horizontal level overlying the first horizontal level and extending along a second direction substantially orthogonal to the first direction, wherein at least one of the first metallization layers is electrically connected to one of the plurality of gate structures or one of the MD conductive features through a conductive via,
      and wherein the plurality of first metallization layers comprises a first metallization layer with a first length along the second direction and a second metallization layer with a second length, along the second direction, different from the first length.

20. The semiconductor device of claim 19, further comprising a second cell, wherein at least one of the first metallization layers continuously extends from the first cell to the second cell.

* * * * *